US009444000B2

(12) United States Patent
Yoshikawa et al.

(10) Patent No.: US 9,444,000 B2
(45) Date of Patent: Sep. 13, 2016

(54) PHOTOELECTRIC CONVERSION DEVICE

(75) Inventors: Akihiko Yoshikawa, Chiba (JP);
Yoshihiro Ishitani, Chiba (JP);
Kazuhide Kusakabe, Chiba (JP)

(73) Assignee: NATIONAL UNIVERSITY CORPORATION CHIBA UNIVERSITY, Chiba-shi, Chiba (JP)

( * ) Notice: Subject to any disclaimer, the term of this patent is extended or adjusted under 35 U.S.C. 154(b) by 678 days.

(21) Appl. No.: 13/394,029

(22) PCT Filed: Jun. 17, 2011

(86) PCT No.: PCT/JP2011/063911
§ 371 (c)(1),
(2), (4) Date: Mar. 21, 2013

(87) PCT Pub. No.: WO2011/158934
PCT Pub. Date: Dec. 22, 2011

(65) Prior Publication Data
US 2013/0174894 A1 Jul. 11, 2013

(30) Foreign Application Priority Data

Jun. 18, 2010 (JP) ................................ 2010-139801
Feb. 28, 2011 (JP) ................................ 2011-043379

(51) Int. Cl.
*H01L 31/0725* (2012.01)
*H01L 31/0304* (2006.01)
*H01L 31/0687* (2012.01)
*H01L 31/0693* (2012.01)
*H01L 31/043* (2014.01)

(52) U.S. Cl.
CPC ..... *H01L 31/0725* (2013.01); *H01L 31/03048* (2013.01); *H01L 31/043* (2014.12); *H01L 31/0687* (2013.01); *H01L 31/0693* (2013.01); *Y02E 10/544* (2013.01); *Y02P 70/521* (2015.11)

(58) Field of Classification Search
CPC ................... H01L 31/03048; H01L 31/0687; H01L 31/0693; H01L 31/043; H01L 31/0725
See application file for complete search history.

(56) References Cited

U.S. PATENT DOCUMENTS 4,688,068 A * 8/1987 Chaffin .................. B82Y 20/00
136/249
7,217,882 B2 5/2007 Walukiewicz et al.
(Continued)

FOREIGN PATENT DOCUMENTS

WO WO 2011/016537 A1 2/2011
WO WO 2011/018984 A1 2/2011

OTHER PUBLICATIONS

English language International Search Report for PCT/JP2011/063911 dated Aug. 2, 2011 (2 pgs).
Office Action for corresponding JP Appln. No. 2012-520506 dated Mar. 3, 2015, including English translation (4 pgs).
(Continued)

*Primary Examiner* — Golam Mowla
(74) *Attorney, Agent, or Firm* — Flynn, Thiel, Boutell & Tanis, P.C.

(57) ABSTRACT

A solar cell is provided with: a first conductivity layer comprising a first conductivity type material; a sensitizer layer formed on the first conductivity layer; and a second conductivity layer comprising a second conductivity type material and formed on the sensitizer layer. At least one of the first conductivity layer, the second conductivity layer and the sensitizer layer has a first semiconductor of a first film thickness and a second semiconductor of a second film thickness.

6 Claims, 14 Drawing Sheets

(56) References Cited

U.S. PATENT DOCUMENTS

| | | | | |
|---|---|---|---|---|
| 2004/0108500 | A1* | 6/2004 | Yoshikawa | B82Y 10/00 257/14 |
| 2007/0151592 | A1* | 7/2007 | Forrest | B82Y 10/00 136/243 |
| 2008/0128745 | A1* | 6/2008 | Mastro | H01L 31/078 257/184 |
| 2009/0057692 | A1* | 3/2009 | Lee | H01L 27/15 257/89 |
| 2009/0321781 | A1* | 12/2009 | Broadley | B82Y 10/00 257/103 |
| 2010/0006143 | A1* | 1/2010 | Welser | B82Y 20/00 136/255 |
| 2012/0186640 | A1 | 7/2012 | Yoshikawa et al. | |

OTHER PUBLICATIONS

Office Action for corresponding JP Appln. No. 2012-520506 dated Aug. 4, 2015, including English translation (6 pgs).

Proposal of ultrathin InN-based asymmetric structure III-N QWs for novel photonic devices: Development from emitters into solar cells, IEICE Technical Report, CPM2009-119, 2009 Nen 11 Gatsu, pp. 79-82.

Enhancement of the photoluminescence intensity in short-period GaAs/AlAs superlattices with different well and barrier thickness, by S. Krylyuk et al, Applied Physics Letters, vol. 74, No. 18, 1999, pp. 2596-2698.

Photoreflectance spectroscopy of coupled $In_xGa_{1-x}As$/GaAs quantum wells, by G. Sek, Thin Solid Films, vol. 364, 2000, pp. 220-223.

\* cited by examiner

2 Tandem Structure

Ternary Alloy System    Binary Superlattice (Quasi-ternary)

3 Tandem Structure

Ternary Alloy System    Binary Superlattice (Quasi-ternary)

PHOTOELECTRIC CONVERSION DEVICE

TECHNICAL FIELD

The present invention relates to a photoelectric conversion device for a wide wavelength region such as from ultraviolet light to infrared light, and especially relates to a photoelectric conversion device preventing degradation due to crystal defect. This application has priorities based on Japanese Patent Application No. 2010-139801 (filed on 2010 Jun. 18) and Japanese Patent Application No. 2011-43379 (filed on 2011 Feb. 28), and cites contents thereof.

The present invention relates to a photoelectric conversion device for a wide wavelength region such as from ultraviolet light to infrared light, and especially relates to a photoelectric conversion device preventing degradation due to crystal defect.

BACKGROUND ART

Recently, there are worries about global warming due to greenhouse effect gas (i.e., carbon dioxide), hereafter efforts for low carbonization and energy conservation have been important to maintain developable society structure.

Especially, under such condition, escape from dependence on fossil fuel is urgent, electric power generation by photoelectric conversion of solar light energy, i.e., a solar cell is a key point to solve the above problem.

Currently, raw material of the almost solar cell is silicon (Si). Meanwhile, in use of requiring high photoelectric conversion efficiency, for example in use of a solar cell mounted on satellites, a solar cell using gallium arsenide (GaAs) of chemical compound semiconductor has been practical to match solar light spectrum.

Next, an example of such solar cell is described with reference to FIG. 27. FIG. 27 is one example thereof and is a block diagram showing a configuration of a solar cell 100 of conventional semiconductor p-n junction type. The solar cell 100 comprises an n-type semiconductor layer 102, and a p-type semiconductor layer 104 formed on the n-type semiconductor layer 102. These are formed as the solar cell (unit cell) by conventional semiconductor production technique or the like.

However, the solar cell 100 uses only wavelength range of solar light corresponding to band gap energy which constituent material includes. Therefore, the solar cell having unit cell is not compatible with wide range of solar light spectrum, thereby limiting the photoelectric conversion efficiency.

Accordingly, solar cell structure of a tandem-type is proposed to widen wavelength range compatible with solar light spectrum, and to enhance photoelectric conversion efficiency. In the tandem-type solar cell, unit cells similar to the solar cell 100 shown in FIG. 27 are electrically and optically connected in series and each unit cell has different energy band gap. The unit cells are layered to be from wide energy band gap to narrow energy band gap by turns from light receiving surface along entering direction of light. That is, the tandem-type structure comprises a plurality of cells similar to the solar cell 100 shown in FIG. 27, each cell has different energy band gap. The tandem-type structure are layered to be from wide energy band gap to narrow energy band gap by turns from light receiving surface along entering direction of light.

For example, in patent reference 1, a tandem-type solar cell is compatible with solar light spectrum of wide wavelength range, since energy band gap is corresponding from 3.4 eV to 0.7 eV.

PRIOR ART REFERENCE

Patent Reference

Patent Reference 1: U.S. Pat. No. 7,217,882

DESCRIPTION OF THE INVENTION

Problems to be Solved by the Invention

A tandem-type solar cell disclosed in patent reference 1 comprises indium gallium nitride (InGaN) with different composition ratios. Indium gallium nitride is mixed crystal of indium nitride (InN) and gallium nitride (GaN). Immiscibility thereof is strong and it is difficult to obtain sufficient crystal quality to operate a solar cell in accordance with high indium composition ratio.

Furthermore, in the construction of the solar cell, lattice mismatch is a problem in heterostructure between growth substrate and InGaN cell, and in the cell. Thus, lattice defect is densely generated in a junction region. As a result, electric current leakage in the solar cell is increased, thereby making a problem such as damage to photoelectric conversion efficiency.

This problem becomes remarkable in the region of mixed crystal composition where indium composition is over 30%. Inventors found that obtaining efficiency just as planned was extremely difficult, for example indium composition is about 41% in a first cell for four tandem-type InGaN solar cells even when adjusted wavelength region is expanded to be longer wavelength region.

Meanwhile, in mixed crystal of indium nitride (InN) and indium gallium nitride (InGaN) with high indium composition, conductivity control is difficult.

That is, in the mixed crystal of indium nitride (InN) and indium gallium nitride (InGaN) with high indium composition, residual donor exists densely in the crystal. Further, high density electron exists on crystal surface, crystal interface and in the vicinity of defect. In the mixed crystal of indium nitride (InN) and indium gallium nitride (InGaN) with high indium composition, p-type conductivity control is more difficult, thereby exact evaluation of electric property of crystal and element also becoming difficult.

A problem related to conductivity control becomes more remarkable in accordance with increase in indium composition. That is, inventors found that realizing expected conversion efficiency was extremely difficult in the tandem-type solar cell disclosed in patent reference 1 due to the above mentioned problem.

The present invention has been performed by considering the mentioned circumstances. Generation of lattice defect in a InGaN tandem-type solar cell is suppressed, while problem of p-type conductivity control in the mixed crystal of indium nitride (InN) and indium gallium nitride (InGaN) with high indium composition is avoided. It is an object of the present invention to provide a solar cell having high photoelectric conversion efficiency. It is another object of the present invention to provide a solar cell having high photoelectric conversion efficiency by facilitating mixed crystal composition control in each cell for a tandem-type solar cell, and by reducing electric current leakage due to lattice defect.

Means for Solving the Problems

A photoelectric conversion device according to a first embodiment of the present invention is provided with: a first conductivity layer comprising a first conductivity type material; a sensitizer layer formed on the first conductivity layer; and a second conductivity layer comprising a second conductivity type material and formed on the sensitizer layer. At least one of the first conductivity layer, the second conductivity layer and the sensitizer layer has a first semiconductor of a first film thickness and a second semiconductor of a second film thickness.

In the photoelectric conversion device according to the first embodiment of the present invention, when the first film thickness is x1 molecular layer thickness of the first semiconductor and the second film thickness is x2 molecular layer thickness of the second semiconductor, the ratio of x1 and x2, i.e., x1/x2 may be about one half, about two thirds, about one or about four.

Furthermore, in the photoelectric conversion device according to the first embodiment of the present invention, when in the first conductivity layer the first film thickness is x11 molecular layer thickness of the first semiconductor and the second film thickness is x12 molecular layer thickness of the second semiconductor, in the second conductivity layer the first film thickness is x21 molecular layer thickness of the first semiconductor and the second film thickness is x22 molecular layer thickness of the second semiconductor, and in the sensitizer layer the first film thickness is x31 molecular layer thickness of the first semiconductor and the second film thickness is x32 molecular layer thickness of the second semiconductor, at least one of the following equations may be satisfied: (x11, x12)=a(x31, x32); and (x21, x22)=a(x31, x32).

In the photoelectric conversion device according to the first embodiment of the present invention, at least one of the first conductivity layer, the second conductivity layer and the sensitizer layer further has the first semiconductor of a third film thickness and the second semiconductor of a fourth film thickness. When in the first conductivity layer the first film thickness is x11 molecular layer thickness of the first semiconductor, the second film thickness is x12 molecular layer thickness of the second semiconductor, the third film thickness is x13 molecular layer thickness of the first semiconductor, and the fourth film thickness is x14 molecular layer thickness of the second semiconductor, in the second conductivity layer the first film thickness is x21 molecular layer thickness of the first semiconductor, the second film thickness is x22 molecular layer thickness of the second semiconductor, the third film thickness is x23 molecular layer thickness of the first semiconductor, the fourth film thickness is x24 molecular layer thickness of the second semiconductor, and in the sensitizer layer the first film thickness is x31 molecular layer thickness of the first semiconductor, the second film thickness is x32 molecular layer thickness of the second semiconductor, the third film thickness is x33 molecular layer thickness of the first semiconductor, and the fourth film thickness is x34 molecular layer thickness of the second semiconductor, at least one of the following equations may be satisfied: (x11, x12)=a(x13, x14); (x21, x22)=a(x23, x24); and (x31, x32)=a(x33, x34).

Furthermore, in the photoelectric conversion device according to the first embodiment of the present invention, the first semiconductor layer and the second semiconductor layer may be alternately layered by lattice match.

Furthermore, in the photoelectric conversion device according to the first embodiment of the present invention, at least one of the first conductivity and the second conductivity may have band gap energy such as about 2.13 eV, about 1.94 eV, about 1.63 eV, about 1.37 eV, about 1.25 eV, or about 0.94 eV, the sensitizer layer may perform photoelectric conversion of energy such as about 0.94 eV or less.

Furthermore, in the photoelectric conversion device according to the first embodiment of the present invention, band gap energy of the first semiconductor may be about 3.4 eV and band gap energy of the second semiconductor may be about 0.63 eV.

Furthermore, in the photoelectric conversion device according to the first embodiment of the present invention, the first semiconductor may be gallium nitride and the second semiconductor may be indium nitride.

Furthermore, in the photoelectric conversion device according to the first embodiment of the present invention, at least one of the first conductivity layer, the second conductivity layer and the sensitizer layer may have natural superlattice structure comprising the first semiconductor and the second semiconductor.

Furthermore, in the photoelectric conversion device according to the first embodiment of the present invention, the first film thickness is x1 molecular layer thickness and the second film thickness is x2 molecular layer thickness. One of the following equations for molecular thicknesses may be satisfied: (x1, x2)=(1, 2), (2, 3), (1, 1), (3, 2), (2, 1) and (4, 1).

In the photoelectric conversion device according to the first embodiment of the present invention, an electrical charge support generated in the sensitizer layer is preferably movable to at least one of the first conduction layer and the second conduction layer.

In the photoelectric conversion device according to the first embodiment of the present invention, the first conduction layer may have a first band gap energy, the second conduction layer may have a second band gap energy, the sensitizer layer may have a third band gap energy, and at least one of the first band gap energy and the second band gap energy may have about 2.13 eV, about 1.94 eV, about 1.63 eV, about 1.37 eV, about 1.25 eV, or about 0.94 eV. The third band gap energy may be smaller than the first band gap energy and the second band gap energy.

In the photoelectric conversion device according to the first embodiment of the present invention, the first film thickness may be one molecular layer thickness of the first semiconductor layer or the second film thickness may be one molecular layer thickness of the second semiconductor layer.

A solar cell according to a second embodiment of the present invention is provided with: a first conductivity layer comprising a first band gap energy; an InN sensitizer layer formed on the first conductivity layer and comprising a third band gap energy; and a second conductivity layer formed on the sensitizer layer and comprising a second band gap energy, wherein at least one of the first conductivity layer and the second conductivity layer has InN of a first film thickness or GaN of a second film thickness. The film thickness of the InN sensitizer layer is two molecular layers or less. The first band gap energy and the second band gap energy are corresponding to about 2.13 eV, about 1.94 eV, about 1.63 eV, about 1.37 eV, about 1.25 eV, or about 0.94 eV. The third band gap energy is less than the first band gap energy and the second band gap energy, and difference thereof is 500 meV or less. The electric charge support generated in the InN sensitizer layer moves to the first conductivity layer and the second conductivity layer by intraband transition.

In a solar cell according to the second embodiment of the present invention, the first film thickness may be one molecular layer thickness of InN or the second film thickness may be one molecular layer thickness of GaN In a solar cell according to the second embodiment of the present invention, when the first film thickness is x1 molecular layer thickness of GaN and the second film thickness is x2 molecular layer thickness of the second semiconductor, the ratio of x1 and x2, i.e., x1/x2 may be about one half, about two thirds, about one, about three seconds or about four.

In a solar cell according to the second embodiment of the present invention, x1 and x2 are natural numbers and one of the following equations may be satisfied: (x1, x2)=(1, 2), (2, 3), (1, 1), (3, 2), (2, 1) and (4, 1).

In a solar cell according to the second embodiment of the present invention, the transition to intraband may be induced by light absorption of low energy such as 0.94 eV or less.

In a solar cell according to the second embodiment of the present invention, the transition to intraband may be induced by thermal energy at room temperature or more.

A solar cell according to a third embodiment of the present invention is a tandem-type solar cell comprising a plurality of cells, wherein at least one of the plurality of cells is provided with: a first conductivity layer comprising a first band gap energy; an InN sensitizer layer formed on the first conductivity layer and comprising a third band gap energy; and a second conductivity layer formed on the sensitizer layer and comprising a second band gap energy. One of the first conductivity layer and the second conductivity layer has InN of a first film thickness and GaN of a second film thickness. The film thickness of the InN sensitizer layer is two molecular layers or less. The film thickness of the InN sensitizer layer is equal to or less than two molecular layers, the third band gap energy is less than the first band gap energy and the second band gap energy and difference thereof is 500 meV or less. An electric charge support generated in the InN sensitizer layer transits to intraband of the first conductivity layer, and the second conductivity layer or the sensitizer layer.

In a solar cell according to the third embodiment of the present invention, when number of rows of the plurality of cells is two, the first film thickness is x1 molecular layer thickness of GaN and the second film thickness is x2 molecular layer thickness of the second semiconductor, the ratio of x1 and x2, i.e., x1/x2 may be about one or about four.

In a solar cell according to the third embodiment of the present invention, x1 and x2 are natural numbers, and one of the following equations may be satisfied: (x1, x2)=(1, 1) or (4, 1).

In a solar cell according to the third embodiment of the present invention, when number of rows of the plurality of cells is three, the first film thickness is x1 molecular layer thickness of GaN and the second film thickness is x2 molecular layer thickness of the second semiconductor, the ratio of x1 and x2, i.e., x1/x2 may be about one half, about two thirds, about three seconds, or about four.

In a solar cell according to the third embodiment of the present invention, x1 and x2 are natural numbers and (x1, x2)=(2, 3), (3, 2), or (4, 1).

In a solar cell according to the third embodiment of the present invention, when number of rows of the plurality of cells is four, the first film thickness is x1 molecular layer thickness of GaN and the second film thickness is x2 molecular layer thickness of the second semiconductor, the ratio of x1 and x2, i.e., x1/x2 may be about one half, about one, about two, or about four.

In a solar cell according to the third embodiment of the present invention, x1 and x2 are natural numbers, and (x1, x2)=(1, 2), (1, 1), (2, 1), or (4, 1).

In a solar cell according to the third embodiment of the present invention, the first band gap energy and the second band gap energy may be about 2.13 eV, about 1.94 eV, about 1.63 eV, about 1.37 eV, about 1.25 eV, or about 0.94 eV.

Effects of the Invention

As described above, according to the present invention, a solar cell having high photoelectric conversion efficiency can be provided by suppressing generation of lattice defect, reducing leakage of electric current, and further avoiding a problem about p-type conductivity control in indium nitride (InN) or indium gallium nitride (InGaN) with high indium composition in nitride semiconductor tandem-type solar cell. Moreover, according to the present invention, a solar cell having high photoelectric conversion efficiency can be provided by facilitating control of mixed crystal composition, reducing leakage of electric current, and further avoiding problem about p-type conductivity control in mixed crystal of indium nitride or indium gallium nitride with high indium composition in nitride semiconductor tandem-type solar cell.

BEST MODE FOR CARRYING OUT THE PRESENT INVENTION

Hereinafter, embodiments of the present invention will be described with reference to figures. However, embodiments are not intended to limit the scope of the invention and are examples for description.

(A First Embodiment)

Figure 1:
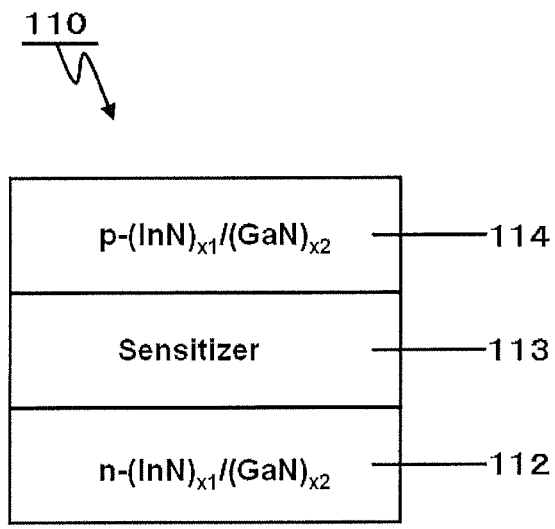
FIG. 1 is a block diagram showing an example of a solar cell according to a first embodiment of the present invention.

Examples for solar cells of the present invention are described with reference to FIGS. 1-4. FIG. 1 is a block diagram showing an example of a solar cell 110 according to a first embodiment. In the FIG. 1, the solar cell 110 is provided with: an n-type indium gallium nitride pseudo-mixed crystal (hereinafter referred to n-$(InN)_{x1}/(GaN)_{x2}$) layer 112; a sensitizer layer 113 formed on the n-type indium gallium nitride pseudo-mixed crystal layer; a p-type indium gallium nitride pseudo-mixed crystal (hereinafter referred to p-$(InN)_{x1}/(GaN)_{x2}$) layer 114 formed on the sensitizer layer; an n-type electrode not displayed and electrically connected to the n-type indium gallium nitride pseudo-mixed crystal layer; and a p-type electrode not displayed and electrically connected to the p-type indium gallium nitride pseudo-mixed crystal layer.

The n-$(InN)_{x1}/(GaN)_{x2}$ layer 112 is used for separating electron and hole pair generated by photoelectric conversion and for transmitting electron to the n-type electrode. The p-$(InN)_{x1}/(GaN)_{x2}$ layer 114 is used for separating electron and hole pair generated by photoelectric conversion and for transmitting hole to the p-type electrode. Thus, each resistivity and layer thickness of the n-type indium gallium nitride pseudo-mixed crystal layer 112 and the p-type indium gallium nitride pseudo-mixed crystal layer 114 is preferably adjusted in view of carrier transportation and yield.

The sensitizer layer 113 is used for photothermal sensitizing effect which facilitates not only solar light corresponding to band gap energy of indium gallium nitride pseudo-mixed crystal ($(InN)_{x1}/(GaN)_{x2}$) forming p-n junction but also longer wavelength light. As described below, solar cell can be configured with high conversion efficiency to enhance electric voltage generation from the solar cell 110 by the effect of the sensitizer layer 113. The n-type electrode and the p-type electrode being not displayed are used for taking out electric power generation.

Figure 2:
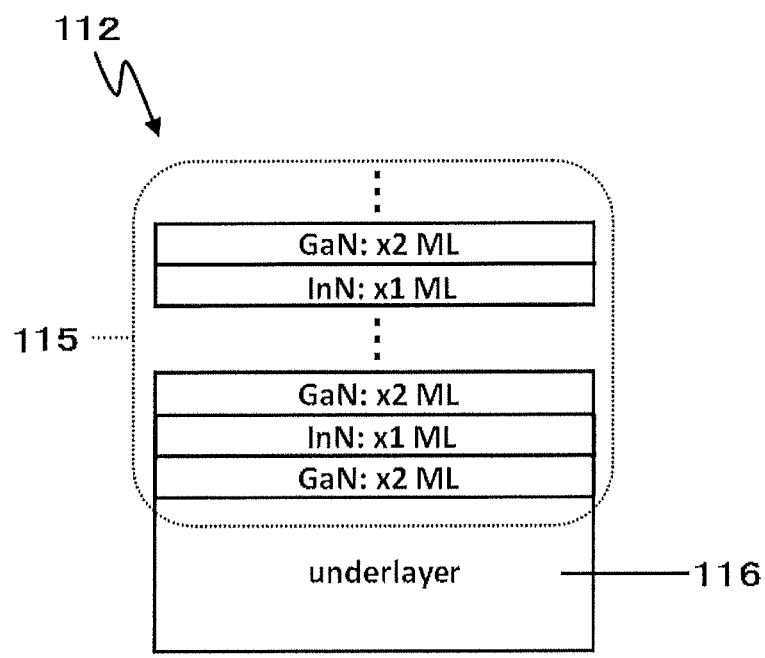
FIG. 2 is a block diagram showing an example of an n-type indium gallium nitride pseudo-mixed crystal layer according to a first embodiment of the present invention.

FIG. 2 is a block diagram showing an example of the n-type indium gallium nitride pseudo-mixed crystal (n-$(InN)_{x1}/(GaN)_{x2}$) layer 112. The pseudo-mixed crystal refers to, for example, reciprocally layered structure of an ultrathin film of GaN and an ultrathin film of InN, and to the same property of InGaN ternary mixed crystal such as mixed crystal composition ratio of equal value with respect to layer thickness ratio (i.e., volume ratio). In FIG. 2, n-$(InN)_{x1}/(GaN)_{x2}$ layer 112 is provided with: a short period superlattice layer 115 comprising InN of layer thickness x1 molecular layer (x1 ML) and GaN of layer thickness x2 molecular layer (x2 ML); and a ground layer 116 formed below the short period superlattice layer 115.

Figure 3:
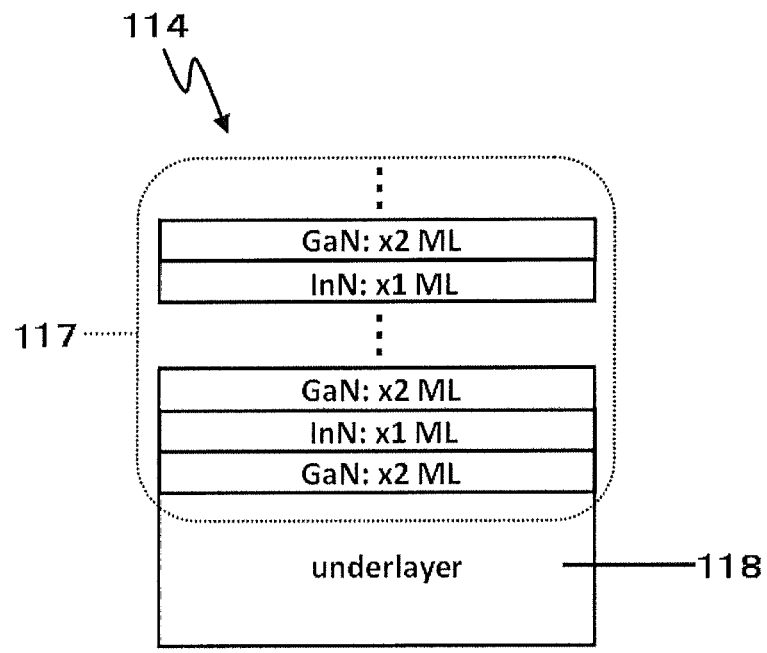
FIG. 3 is a block diagram showing an example of a p-type indium gallium nitride pseudo-mixed crystal layer according to a first embodiment of the present invention.

FIG. 3 is a block diagram showing an example of the p-type indium gallium nitride pseudo-mixed crystal (p-$(InN)_{x1}/(GaN)_{x2}$) layer 114. In FIG. 3, p-$(InN)_{x1}/(GaN)_{x2}$ layer 114 is provided with: a short period superlattice layer 117 comprising InN of layer thickness x1 molecular layer (x1 ML) and GaN of layer thickness x2 molecular layer (x2 ML); and a ground layer 118 formed below the short period superlattice layer 117.

The solar cell 110 shown in FIG. 1 has property of crystal growth by conventional semiconductor technique. When crystal growth is performed along c-plane, since InN and GaN has about 11% of lattice mismatch, lattice defect of high density is introduced in general case. The lattice defect remarkably deteriorates element property of the solar cell.

However, even in the lattice mismatched system such as InN and GaN, when layer thickness is sufficient thin, elastic deformation thereof is maintained to form pseudo-lattice matched system. That is, introduction of the lattice defect can be controlled. The short period superlattice layers 115 and 117 provide corresponding coherent structure.

Since InN and GaN are immiscible, homogeneous mixed crystal composition is difficult to be realized in InGaN of mixed crystal thereof. However, growth processes of the short period superlattice layers 115 and 117 do not require to be homogeneously mixed. That is, inventors found that InN/GaN short period superlattice was formed with extremely stable structure by effectively using the immiscibility.

Furthermore, growth processes of self-order and self-stop, which are different from that of conventional crystal, can be possible by the immiscibility being effectively functioned, so that the ultrathin film structure is easily controlled within the molecular layer order of InN and GaN.

Inventors found that growth temperature of InN, for example, was limited to about 600° C. or less by a molecular beam epitaxy (MBE) method, however the growth temperature could be possible at 600° C. or more by molecular layer order of the ultrathin film of InN. The crystal property of InN/GaN short period superlattice is extremely enhanced.

That is, in n-type indium gallium nitride pseudo-mixed crystal layer 112 and p-type indium gallium nitride pseudo-mixed crystal layer 114, the short period superlattice layers 115 and 117 enable pseudo-lattice matched system to suppress lattice defect. Moreover, growth at high temperature makes enhancement of crystalline property, thereby facilitating high conversion efficiency without deteriorating element property of the solar cell.

Figure 4:
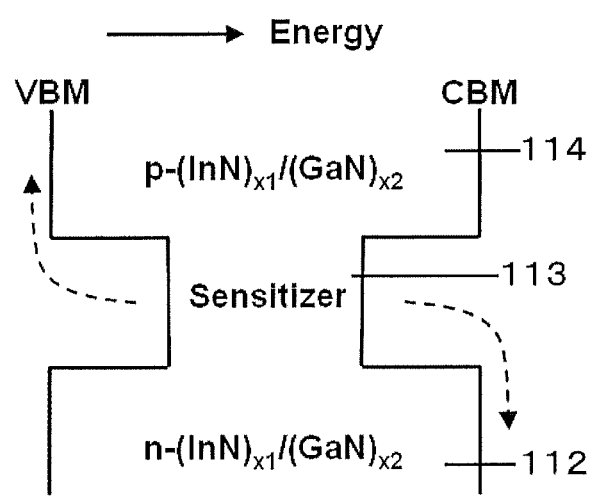
FIG. 4 is a schematic diagram showing band line-up of an n-type indium gallium nitride pseudo-mixed crystal layer, a sensitizer layer, and a p-type indium gallium nitride pseudo-mixed crystal layer according to a first embodiment of the present invention.

Next, the sensitizer layer 113, which is a main component of the solar cell 110, is described. The FIG. 4 is a schematic diagram showing effective band line-up of n-type indium gallium nitride pseudo-mixed crystal layer 112, the sensitizer layer 113, and the p-type indium gallium nitride pseudo-mixed crystal layer 114. In FIG. 4, the sensitizer layer 113 is sandwiched between n-$(InN)_{x1}/(GaN)_{x2}$ layer 112 and p-$(InN)_{x1}/(GaN)_{x2}$ 114. CBM and VBM refer to conduction band bottom portion and valence band top portion, respectively. Energy is increasing from left side to right side in FIG. 4.

Band gap energies of InN and GaN are about 0.63 eV and about 3.4 eV, respectively. Effective band gap energies of n-$(InN)_{x1}/(GaN)_{x2}$ layer 112 and p-$(InN)_{x1}/(GaN)_{x2}$ layer 114 are arbitrarily controlled between about 0.63 eV and about 3.4 eV by varying each layer thickness x1 and x2 of InN and GaN. Furthermore, band gap energy of the sensitizer layer 113 is designed to be less than effective band gap energies of the n-$(InN)_{x1}/(GaN)_{x2}$ layer 112 and the p-$(InN)_{x1}/(GaN)_{x2}$ layer 114.

Energy difference between band gap energy of the sensitizer layer 113, and effective band gap energies of the n-$(InN)_{x1}/(GaN)_{x2}$ layer 112 and the p-$(InN)_{x1}/(GaN)_{x2}$ layer 114 is preferably less than 500 meV. Furthermore, the above energy difference is preferably less than 200 meV.

In the energy difference thereof, even in thermal excitation process at room temperature, carrier can move from the sensitizer layer 113 to the n-GaN layer 112 and the p-GaN layer 114. In order to satisfy this condition, the sensitizer layer 113 comprises, for example, InGaN short period superlattice, InN/GaN short period superlattice or the combination thereof.

Furthermore, for example, carrier movement is promoted from the sensitizer layer 113 to the n-$(InN)_{x1}/(GaN)_{x2}$ layer 112 and the p-$(InN)_{x1}/(GaN)_{x2}$ layer 114 by using process of intraband transition where light less than 0.63 eV photon energy, which is not absorbed even in InN, is absorbed. In solar light spectrum, for example in AM 1.5 spectrum, the spectrum region less than about 0.63 eV cannot be omitted and exists about 9% in photon density and about 4% in irradiation power density.

The sensitizer layer 113 is positioned on interface region of the n-$(InN)_{x1}/(GaN)_{x2}$ layer 112 and the p-$(InN)_{x1}/(GaN)_{x2}$ layer 114, that is, positioned adjacent to the p-n junction. Thus, inherent electric field is applied. In the sensitizer layer 113, carrier generated by interband absorption is promptly and spatially separated by the inherent electric field. Thus recombination probability is negligibly small. In this reason, each electron and hole generated in the sensitizer layer 113 undergoes thermal excitation or infrared light absorption of intraband transition, thereby carrier moving into the n-$(InN)_{x1}/(GaN)_{x2}$ layer 112 and the p-$(InN)_{x1}/(GaN)_{x2}$ layer 114. Thus photothermal sensitizing effect is realized.

The photothermal sensitizing effect enhances operation property of the solar cell. For example, when the energy difference is 200 meV, the photothermal sensitizing effect makes increase in electric voltage of about 200 meV, thereby increasing an open circuit voltage of the end of the solar cell 110. That is, when compared with InGaN ternary mixed crystal p-n junction of which basic absorption end is same, since absorbable number of photons is same, short circuit electric density is also same. However, an open circuit voltage in the end is increased by the photothermal sensitizing effect to contribute enhancement of conversion efficiency for the solar cell.

Furthermore, the first embodiment mentioned an example according to the short period superlattice of InN/GaN, however it is not limited thereto. For example, it includes short period superlattice according to indium gallium nitride aluminum (hereinafter refers to $In_xGa_yAl_{1-x-y}N$, wherein 0≤x, y≤1), and a configuration of p-n junction according to $In_xGa_yAl_{1-x-y}N$ pseudo-mixed crystal and the sensitizer layer. Width of band gap energy of $In_xGa_yAl_{1-x-y}N$ is arbitrarily varied by changing mixed crystal ratio of x and y.

Furthermore, the first embodiment mentioned an example according to p-n junction of indium gallium nitride pseudo-mixed crystal. However, the bottom layers 116 and 118 comprising the n-type indium gallium nitride pseudo-mixed crystal layer 112 and the p-type indium gallium nitride pseudo-mixed crystal layer 114 may be configured by the short period superlattice. As one example of this configuration, when the bottom layers 116 and 118 comprise the short period superlattices 115 and 117, the n-type indium gallium nitride pseudo-mixed crystal layer 112 and the p-type indium gallium nitride pseudo-mixed crystal layer 114 can comprise only InN/GaN short period superlattice, thereby remarkably suppressing lattice defect which is a characteristic of coherent structure.

InN/GaN short period superlattice, the n-type indium gallium nitride pseudo-mixed crystal layer 112, and the p-type indium gallium nitride pseudo-mixed crystal layer 114 in the first embodiment not only may be a layered structure where the ultrathin film of InN and the ultrathin film of GaN are artificially layered by turns but also may be spontaneous metastable nano-structure (i.e., natural superlattice) by treatments such as thermal treatment, laser irradiation or electron beam irradiation. According to this configuration, lattice defect, which is a characteristic of coherent structure, can be suppressed.

Furthermore, as shown in FIGS. 1-4, the first embodiment mentioned that the sensitizer layer 113 was only a configuration of one layer. However, for example a configuration having multilayer structure may be possible where plural sensitizer layers 113 are inserted. According to this configuration, by increase in number of layers of the plural inserted sensitizer layers 113, light absorption is also increased. Thus, photothermal sensitizing effect can be increased. In this case, multilayer structure of the sensitizer layer 113 protruding from a depletion region of p-n junction interface may be used.

Furthermore, the sensitizer layer 113 for both single layer and multilayer can have modulated doping structure which adequately varies carrier density located in near the sensitizer layer 113. According to this configuration, a depletion region of p-n junction interface can be preferably controlled.

(A Second Embodiment)

In the first embodiment, configuration of the solar cell (unit cell) having the photothermal sensitizing effect was described. In a second embodiment, a tandem-type solar cell comprising plural cells mentioned in the first embodiment will be described with reference to FIGS. 5-8.

In a conventional technique of patent reference 1, in order to cover wide range of solar cell spectrum as much as possible, disclosed is a configuration of pn-InN cell where the last end cell (cell corresponding to maximum wavelength) absorbs light up to about 0.63 eV as photon energy.

However, there is a big problem in conductivity control of indium nitride (InN) and indium gallium nitride (InGaN) with high indium composition. Thus, it is extremely difficult to form pn-InN junction. Furthermore, band gap energy of InN is as small as 0.63 eV and electric voltage generation from pn-InN cell is small. That is, inventors found that even though pn-InN cell was incorporated into a configuration of the tandem structure, difficulty of production process was merely increased and contribution to enhancement of conversion efficiency was not expected.

Thus, instead of using the wide range of solar light spectrum as much as possible, investigation on effective use of the solar light spectrum was performed by excluding pn-InN from the tandem structure without damaging conversion efficiency of the solar cell.

Figure 5:
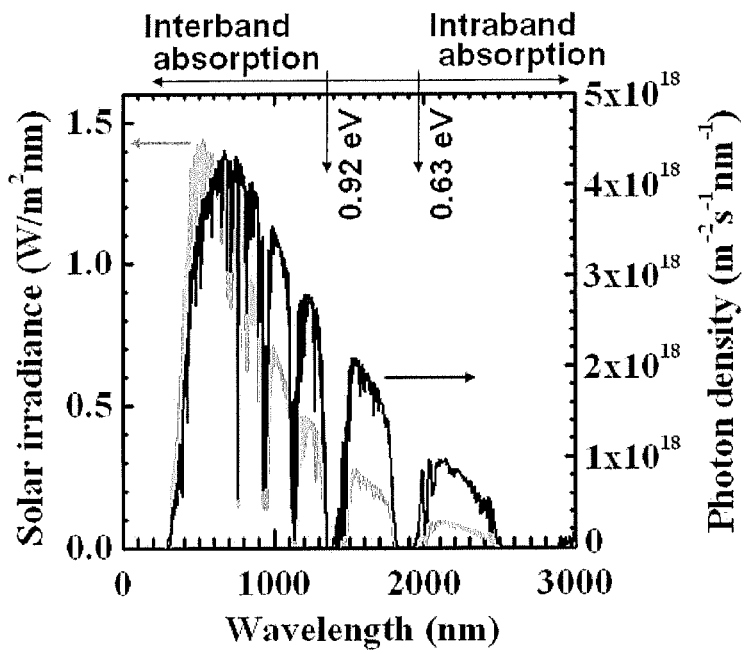
FIG. 5 is a graph showing solar light AM 1.5 spectrum.

FIG. 5 is a graph showing AM 1.5 solar light spectrum and showing solar irradiation (gray color and corresponding to a vertical axis of left side) and photon density (black color and corresponding to a vertical axis of right side) with respect to wavelength. The source of data is standard spectrum using "ASTM G173-03 Reference Spectra Derivied from SMARTS v.2.9.2".

As shown in FIG. 5, in the infrared wavelength region of solar light, wavelength region of spectrum loss by atmosphere/moisture absorption is found here and there. Especially, in the wavelength region form 1350 nm to 2000 nm including band gap energy of about 0.63 eV of InN, the spectrum loss is remarkable. That is, even though the wavelength region is not covered by the tandem cell, conversion efficiency is not largely damaged.

Furthermore, InGaN ternary mixed crystal comprising the tandem cell or InGaN pseudo-mixed crystal is preferably to be in a shorter wavelength range to cover wavelength region. That is, by taking effective indium composition as small as possible, it is possible to avoid a problem about conductivity control existing in the above mentioned InN and InGaN with high indium composition.

As a result, solar cell spectrum composition up to about 0.92 eV (1352 nm of wavelength) is absorbed by interband transition of each cell of the tandem structure, i.e., is used as electric current composition. Meanwhile, inventors found that solar cell spectrum composition with longer wavelength region was used as intraband excitation for photothermal sensitizing effect.

When solar light spectrum up to about 0.63 eV (1968 nm of wavelength) was covered by the tandem cell as interband transition, photon density was $5\times10^{21}$ m$^{-2}$ s$^{-1}$ nm$^{-1}$. However, when solar light spectrum was up to 0.92 eV (1352 nm of wavelength), photon density was reduced to $3.0\times10^{21}$ m$^{-2}$ s$^{-1}$ nm$^{-1}$. Since electric power contribution from the last end cell corresponding to longer wavelength is not much, conversion efficiencies of the tandem-type solar cells have almost same values in case of 0.63-cutoff and 0.92-cutoff. This will be described below.

Next, when solar cell spectrum composition up to about 0.92 eV is used for interband transition, a tandem structure is described. In a tandem-type solar cell, electric field conservation law maintaining constant electric field generation in each cell should be satisfied. In accordance with electric field conservation law, 2-4 junction types of solar cells (2-4 tandem-types) were designed.

Figure 6:
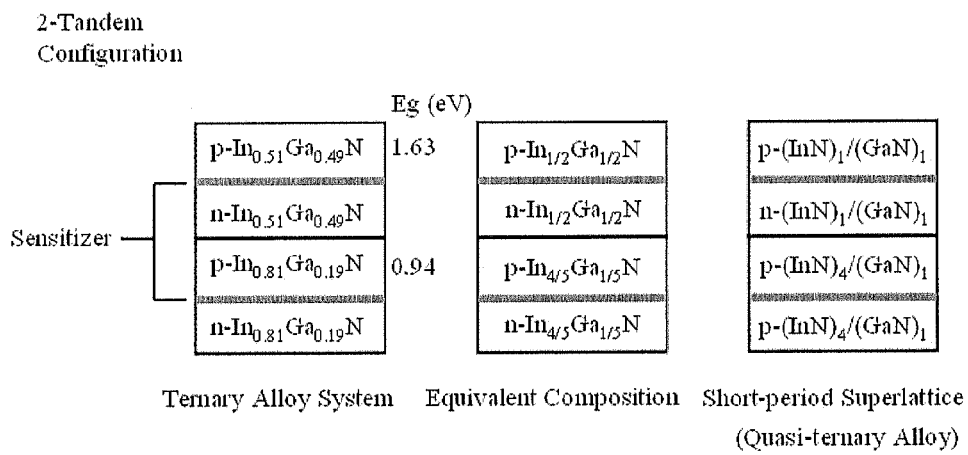
FIG. 6 is a schematic diagram showing an example of a tandem-type solar cell according to a second embodiment of the present invention.

FIG. 6 is a schematic diagram showing an example of two tandem-types of solar cells (two tandems). Each cell comprises pn-InGaN junction satisfying electric field conservation law and the sensitizer layer therebetween.

A characteristic of the sensitizer layer is described with reference to FIG. 4. Potential barrier between the sensitizer and pn-InGaN (difference of band gap energy) is determined by linear approximation such as Vegard's law of "200× (effective gallium composition of InGaN) meV". For example, energy difference is 200 meV when the sensitizer layer is incorporated into pn-GaN junction. The energy difference is 100 meV when the sensitizer layer is incorporated into pn-In$_{0.5}$Ga$_{0.5}$N.

In order to satisfy electric field conservation law in two cells, as shown in left side of FIG. 6, band gap energies of pn-InGaN junction with respect to solar light spectrum up to 0.92 eV (1352 nm of wavelength) are 1.63 eV and 0.94 eV, respectively. With respect to the solar light spectrum up to 0.92 eV, band gap energy of InGaN for a second (the last) cell different from 0.92 eV is caused by photothermal sensitizing effect. In this case, potential barrier is corresponding to 20 meV.

Indium compositions of InGaN mixed crystal corresponding to 1.63 eV and 0.94 eV are 0.51 and 0.81, respectively. These can simply expressed by fractional equation. The ratios of mixed crystal composition, as shown in the center of the FIG. 6, are approximately In$_{1/2}$Ga$_{1/2}$ and In$_{4/5}$Ga$_{1/5}$N, respectively. Generally, in spite of the mixed crystal ratio being analogous value of zero or one, in accordance with design rule of the tandem-type solar cell, simple fractional equation, i.e., discrete mixed crystal composition ratio can be used.

As shown in right side of FIG. 6, this discrete mixed crystal composition ratio with fractional equation represent that the tandem-type solar cell can be configured by using InN/GaN short period superlattice, i.e., pseudo-mixed crystal (digital mixed crystal) as corresponding mixed crystal composition. In$_{1/2}$Ga$_{1/2}$N is corresponding to layer thickness ratio of InN and GaN, i.e. InN:GaN=1:1, for example one molecular layer of InN (1 ML—InN)/one molecular layer of GaN (1 ML—GaN) short period superlattice (hereinafter referred to (InN)$_1$/(GaN)$_1$). In$_{4/5}$Ga$_{1/5}$N is corresponding to four molecular layers of InN (4 ML—InN)/one molecular layer of GaN (1 ML—GaN) short period superlattice (hereinafter referred to (InN)$_4$/(GaN)$_1$).

Figure 7:
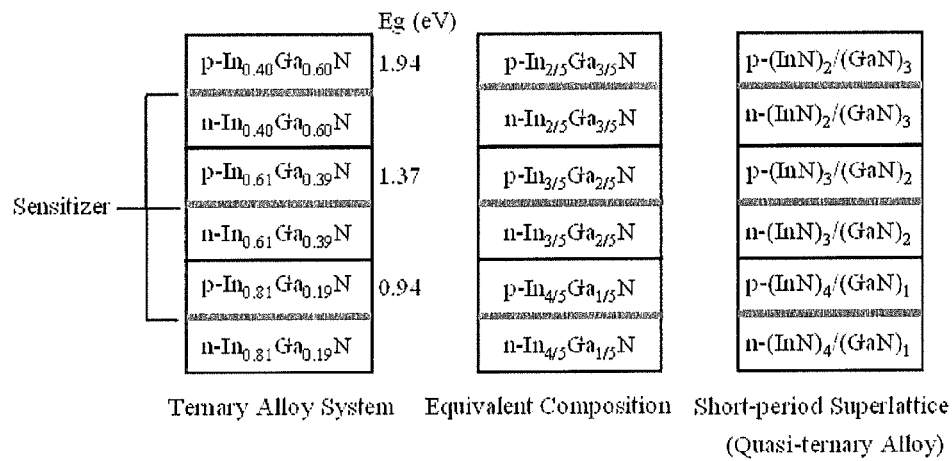
FIG. 7 a schematic diagram showing an example of a tandem-type solar cell according to a second embodiment of the present invention.

FIG. 7 is a schematic diagram showing an example of a tandem-type solar cell comprising three cells (three tandems), each cell comprises pn-InGaN junction satisfying electric field conservation law, and the sensitizer layer therebetween.

In order to satisfy electric field conservation law in three cells with respect to solar light spectrum up to 0.92 eV (1352 nm of wavelength), as shown in left side of FIG. 7, band gap energies of pn-InGaN junctions are 1.94 eV, 1.37 eV, and 0.94 eV, respectively. With respect to solar light speculum up to 0.92 eV, band gap of InGaN for a third (the last) cell is different from 0.92 eV. This is caused by the photothermal sensitizing effect. In this case, the potential barrier is corresponding to 20 meV.

At this time, indium compositions of InGaN mixed crystal corresponding to 1.94 eV, 1.37 eV, and 0.94 eV are 0.40, 0.61, and 0.81, respectively. These can be simply expressed by fraction equation. As shown in the center of FIG. 7, the mixed crystal composition ratios are approximately $In_{2/5}Ga_{3/5}N$, $In_{3/5}Ga_{2/5}N$, and $In_{4/5}Ga_{1/5}N$. Generally, in spite of the mixed crystal ratio being analogous value of zero or one, in accordance with design rule of the tandem-type solar cell, simple fractional equation, i.e., discrete mixed crystal composition ratio can be used.

As shown in right side of FIG. 7, this discrete mixed crystal composition ratio with fractional equation represent that the tandem-type solar cell can be configured by using InN/GaN short period superlattice, i.e., pseudo-mixed crystal (digital mixed crystal) as corresponding mixed crystal composition. For example, $In_{2/5}Ga_{3/5}N$ is two molecular layers of InN (2 ML—InN)/three molecular layers of GaN (3 ML—GaN) short period superlattice (hereinafter referred to $(InN)_2/(GaN)_3$). $In_{3/5}Ga_{2}$ is corresponding to three molecular layers of InN (3 ML—InN)/two molecular layers of GaN (2 ML—GaN) short period superlattice (hereinafter referred to $(InN)_3/(GaN)_2$). $In_{4/5}Ga_{1/5}N$ is corresponding to four molecular layers of InN (4 ML—InN)/one molecular layer of GaN (1 ML—GaN) short period superlattice (hereinafter referred to $(InN)_4/(GaN)_1$).

Figure 8:
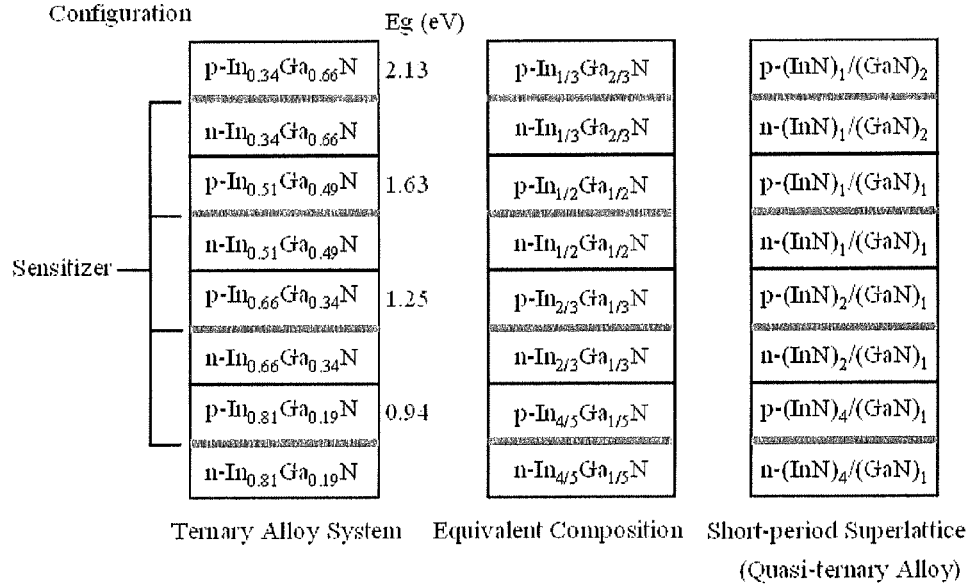
FIG. 8 is a schematic diagram showing an example of a tandem-type solar cell according to a second embodiment of the present invention.

FIG. 8 is a schematic diagram showing an example of a tandem-type solar cell comprising four cells (four tandems), each cell comprises pn-InGaN junction and the sensitizer layer therebetween.

In order to satisfy electric field conservation law in four cells, as shown in left side of FIG. 8, band gap energies of pn-InGaN junction with respect to solar light spectrum up to 0.92 eV (1352 nm of wavelength) are 2.13 eV, 1.63 eV, 1.25 eV, and 0.94 eV, respectively. Band gap energy of InGaN for a fourth (the last) cell is different from 0.92 eV with respect to solar light spectrum up to 0.92 eV. This is caused by photothermal sensitizing effect. In this case, the potential barrier is corresponding to 20 meV.

At this time, indium compositions of InGaN mixed crystal corresponding to 2.13 eV, 1.63 eV, 1.25 eV, and 0.94 eV are 0.34, 0.51, 0.66, and 0.81, respectively. These can be simply expressed by fractional equation. The ratios of mixed crystal composition, as shown in the center of the FIG. 8, are approximately $In_{1/3}Ga_{2/3}N$, $In_{1/2}Ga_{1/2}N$, $In_{2/3}Ga_{1/3}N$, and $In_{4/5}Ga_{1/5}N$, respectively. Generally, in spite of the mixed crystal ratio being analogous value of zero or one, in accordance with design rule of the tandem-type solar cell, simple fractional equation, i.e., discrete mixed crystal composition ratio can be used.

As shown in right side of FIG. 8, this discrete mixed crystal composition ratio with fractional equation represent that the tandem-type solar cell can be configured by using InN/GaN short period superlattice, i.e., pseudo-mixed crystal (digital mixed crystal) as corresponding mixed crystal composition. For example, $In_{1/3}Ga_{2/3}N$ is one molecular layer of InN (1 ML—InN)/two molecular layers of GaN (2 ML—GaN) short period superlattice (hereinafter referred to $(InN)_1/(GaN)_2$). $In_{1/2}Ga_{1/2}N$ is corresponding to one molecular layer of InN (1 ML—InN)/one molecular layer of GaN (1 ML—GaN) short period superlattice (hereinafter referred to $(InN)_1/(GaN)_1$). $In_{2/3}Ga_{1/3}N$ is two molecular layers of InN (2 ML—InN)/one molecular layer of GaN (1 ML—GaN) short period superlattice (hereinafter referred to $(InN)_2/(GaN)_1$). $In_{4/5}Ga_{1/5}N$ is corresponding to four molecular layers of InN (4 ML—InN)/one molecular layer of GaN (1 ML—GaN) short period superlattice (hereinafter referred to $(InN)_4/(GaN)_1$).

As mentioned above, with respect to solar light spectrum up to 0.92 eV (1352 nm of wavelength), when electric current conservation law is satisfied from two tandem structures to four tandem structures, any of tandem structures was found to be mixed crystal composition of discrete fractional equation. It is distinctly understood from the viewpoint of two tandem structures and four tandem structures. Even in multiples of from two tandem structures to four tandem structures, mixed crystal composition of discrete fractional equation can be possible. In these mixed crystal composition ratios, replacement in simple InN/GaN short period superlattice (pseudo-mixed crystal) can be possible and superior effect over ternary InGaN mixed crystal can be expected.

InN and GaN are lattice mismatched system and have strong immiscibility. Thus, InN and GaN are required to be in the tandem-type solar cell. It is extremely difficult to obtain high quality crystal for a device of InGaN mixed crystal having indium composition over 30%. However, in the growth of InN/GaN pseudo-mixed crystal without mixing InN and GaN, the immiscibility becomes reversely good effect to make the solar cell with highly stable structure.

Furthermore, InN and GaN serving as ultrathin films reciprocally maintain elastic deformation, thereby facilitating formation of pseudo-lattice matched system. That is, introduction of lattice defect can be suppressed. Since the effect of variation of indium composition is largely suppressed, design value of wavelength division for the tandem structure is substantially reproduced.

Furthermore, so-called distorted superlattice buffer effect, known in other chemical compound semiconductor, can be expected. Penetrated dislocation formed in the interface between growth layer and growth substrate is restrained, thereby suppressing crack due to thermal extension and residual stress between growth layer and grow substrate.

Furthermore, an effect on active energy reduction of magnesium acceptor, known in GaN/AlGaN based superlattice, can be expected, thereby facilitating conductivity control, especially p-type conductivity control.

(A Third Embodiment)

In a third embodiment, a sensitizer layer and an oblique band type carrier traveling layer according to an InN/GaN short period superlattice configuration are described with reference to from FIG. 9 to FIG. 17.

Figure 9:
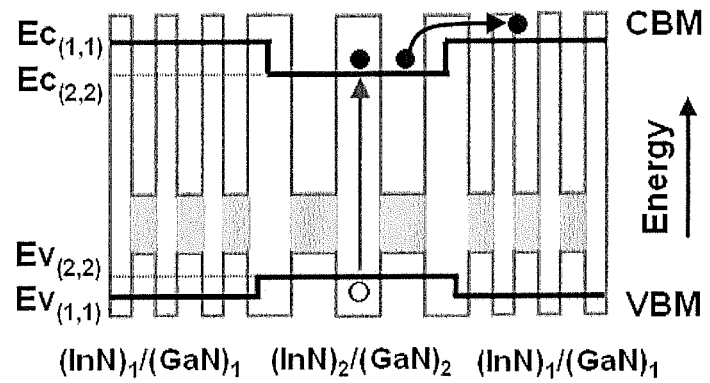
FIG. 9 is a schematic diagram showing an example of band line-up of a sensitizer layer according to a third embodiment of the present invention.

FIG. 9 is a schematic diagram showing an example of band line-up of the sensitizer layer in the solar cell according to the third embodiment. In FIG. 9, examples of the sensitizer layer are one molecular layer of InN (1 ML—InN)/one molecular layer of GaN (1 ML—GaN) short period superlattice (hereinafter referred to $(InN)_1/(GaN)_1$) maintaining the layer thickness ratio of InN and GaN, i.e., InN:GaN=1:1 and two molecular layers of InN (2 ML—InN)/two molecular layers of GaN (2 ML—GaN) short period superlattice (hereinafter referred to $(InN)_2/(GaN)_2$). CBN and VBM refer to conduction band bottom portion and valence band top portion of the sensitizer layer, respectively. Energy is increasing from bottom side to top side in FIG. 9. Wide band gap is corresponding to GaN and narrow band gap is corresponding to InN. Furthermore, $E_{c(1,1)}$ refers to effective conduction band bottom portion of $(InN)_1/(GaN)_1$, $E_{c(2,2)}$ refers to effective conduction band bottom portion of $(InN)_2/(GaN)_2$. Meanwhile, $E_{v(1,1)}$ refers to effective valence band top portion of $(InN)_1/(GaN)_1$, $E_{v(2,2)}$ refers to effective valence band top portion of $(InN)_2/(GaN)_2$.

A first characteristic of the sensitizer layer in FIG. 9 is that since layer thickness ratio of the ultrathin film of InN and the ultrathin film of GaN is specific value, average lattice constant is constantly maintained. That is, pseudo-lattice matched system can be formed, thereby suppressing introduction of lattice defect.

A second characteristic of the sensitizer layer in FIG. 9 is that size of potential barrier between the sensitizer layer and a p-n layer area (difference of band gap energy) is about several hundreds meV according to theoretical simulation. For example, in FIG. 9, difference of band gap energies of $(InN)_1/(GaN)_1$ and $(InN)_2/(GaN)_2$ (i.e., difference of $E_{c(1,1)}-E_{v(1,1)}$ and $Ec_{(2,2)}-E_{v(2,2)}$) is about 110 meV. This value is preferable in the above mentioned photothermal sensitizing effect.

Figure 10:
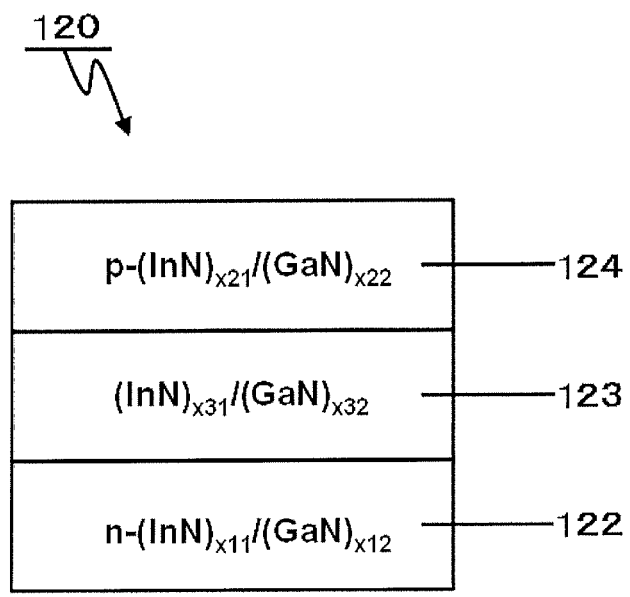
FIG. 10 is a block diagram showing an example of a solar cell according to a third embodiment of the present invention.

Next, a solar cell 120 having the sensitizing layer according to InN/GaN short period superlattice (pseudo-mixed crystal) is described. In FIG. 10, the solar cell 120 is provided with: an n-type indium gallium nitride pseudo-mixed crystal (hereinafter referred to n-$(InN)_{x11}/(GaN)_{x12}$) layer 122; a indium gallium nitride pseudo-mixed crystal (hereinafter referred to $(InN)_{x31}/(GaN)_{x32}$) sensitizer layer 123 formed on the n-type indium gallium nitride pseudo-mixed crystal layer 122; a p-type indium gallium nitride pseudo-mixed crystal (hereinafter referred to p-$(InN)_{x21}/(GaN)_{x22}$) layer 124 formed on the indium gallium nitride pseudo-mixed crystal sensitizer layer 123; an n-type electrode not displayed and electrically connected to the n-type indium gallium nitride pseudo-mixed crystal layer 122; and a p-type electrode not displayed and electrically connected to the p-type indium gallium nitride pseudo-mixed crystal layer 124.

The n-$(InN)_{x11}/(GaN)_{x12}$ layer 122 is used for separating electron and hole pair generated by photoelectric conversion and for transmitting electron to the n-type electrode. The p-$(InN)_{x21}/(GaN)_{22}$ layer 124 is used for separating electron and hole pair generated by photoelectric conversion and for transmitting hole to the p-type electrode. Thus, each resistivity and layer thickness of the n-type indium gallium nitride pseudo-mixed crystal layer 122 and the p-type indium gallium nitride pseudo-mixed crystal layer 124 is preferably adjusted in view of carrier transportation and yield.

The $(InN)_{x31}/(GaN)_{x32}$ sensitizer layer 123 is used for photothermal sensitizing effect which facilitates not only solar light corresponding to band gap energy of the indium gallium nitride pseudo-mixed crystal (short period superlattice) forming p-n junction but also longer wavelength light. As described below, a solar cell can be configured with high conversion efficiency to enhance electric voltage generation from the solar cell 110 by the indium gallium nitride pseudo-mixed crystal sensitizer layer 123. The n-type electrode and the p-type electrode being not displayed are used for taking out electric power generation.

Figure 11:
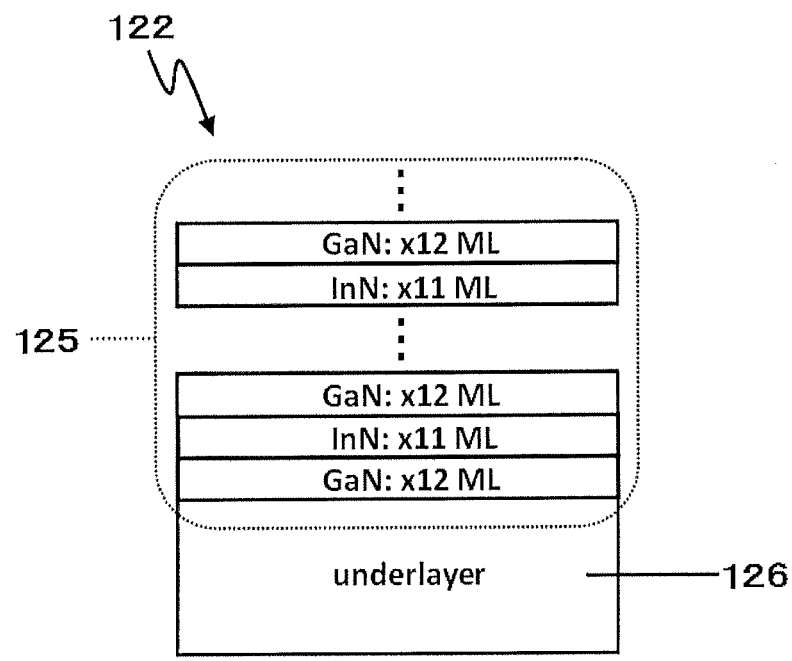
FIG. 11 is a block diagram showing an example of an n-type indium gallium nitride pseudo-mixed crystal layer according to a third embodiment of the present invention.

FIG. 11 is a block diagram showing an example of the n-type indium gallium nitride pseudo-mixed crystal ($(InN)_{x11}/(GaN)_{x12}$) layer 122. The pseudo-mixed crystal means, for example, reciprocal layered structure of the ultrathin film of GaN and the ultrathin film of InN and has the same property with the InGaN ternary mixed crystal such as equivalent mixed crystal ratio with layer thickness ratio (i.e., volume ratio). In FIG. 11, $(InN)_{x11}/(GaN)_{x12}$ layer 122 is provided with: a short period superlattice 125 comprising InN serving as a molecular layer with molecular thickness x11 (x11 ML) and GaN serving as a molecular layer with molecular thickness x12 (x12 ML); and a bottom layer 126 formed under the short period superlattice 125.

Figure 12:
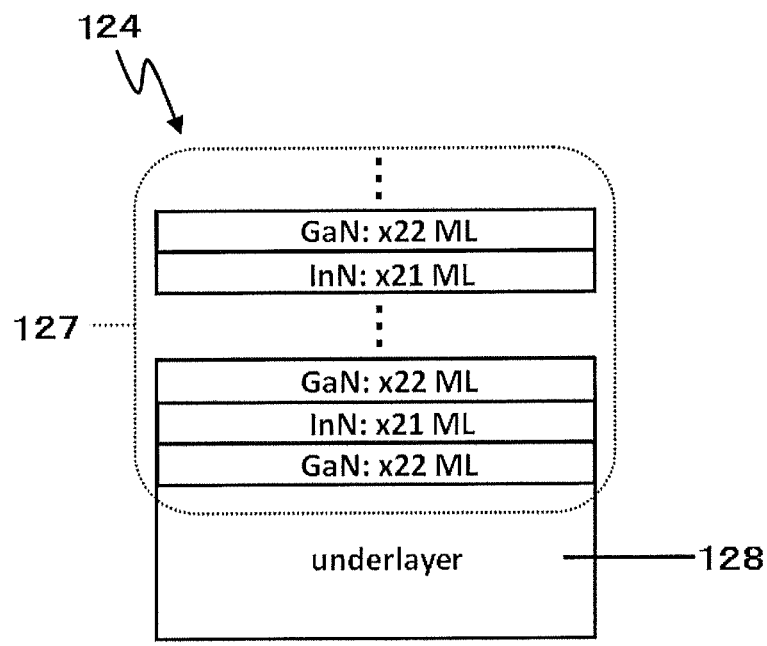
FIG. 12 is a block diagram showing an example of a p-type indium gallium nitride pseudo-mixed crystal layer according to a third embodiment of the present invention.

FIG. 12 is a block diagram of an example of the p-type indium gallium nitride pseudo-mixed crystal ($(InN)_{x21}/(GaN)_{x22}$) layer 124. In FIG. 12, the p-$(InN)_{x21}/(GaN)_{x22}$ layer 124 is provided with: a short period superlattice 127 comprising InN serving as a molecular layer with molecular thickness x21 (x21 ML) and GaN serving as a molecular layer with molecular thickness x22 (x22 ML); and a bottom layer 128 formed under the short period superlattice 127.

Figure 13:
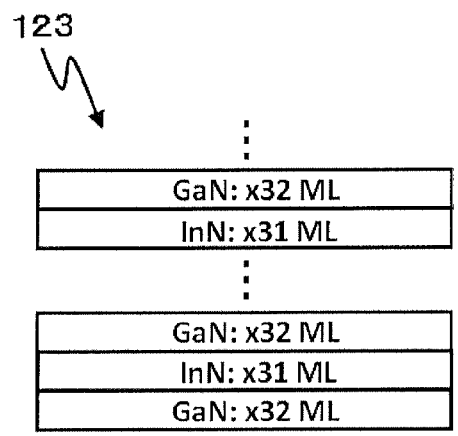
FIG. 13 is a block diagram showing an example of a sensitizer layer according to a third embodiment of the present invention.

FIG. 13 is a block diagram of an example of an indium gallium nitride pseudo-mixed crystal ($(InN)_{x31}/(GaN)_{x32}$) sensitizer layer 123. In FIG. 13, the $(InN)_{x31}/(GaN)_{x32}$ sensitizer layer 123 is provided with a short period superlattice comprising InN serving as a molecular layer with molecular thickness x31 (x31 ML) and GaN serving as a molecular layer with molecular thickness x32 (x32 ML).

The solar cell 120 shown in FIG. 10 is crystal growth property by conventional semiconductor technique. When crystal growth is performed along c-plane, since InN and GaN have about 11% of lattice mismatch, lattice defect with high density is introduced in general case. The lattice defect remarkably deteriorates element property of the solar cell.

However, even in a lattice mismatched system such as InN and GaN, when layer thickness is sufficient thin, elastic deformation thereof is maintained to form a pseudo-lattice matched system. That is, introduction of lattice defect can be controlled.

Especially, in all of the n-type indium gallium nitride pseudo-mixed crystal layer 122, the p-type indium gallium nitride pseudo-mixed crystal layer 124 and the indium gallium nitride pseudo-mixed crystal sensitizer layer 123, or in a portion thereof, by constantly maintaining layer thickness ratio of InN and GaN for an InN/GaN short period superlattice, coherent structure forming pseudo-lattice matched system suppresses lattice defect.

Since InN and GaN are immiscible, homogeneous mixed crystal composition is difficult to be realized in InGaN of mixed crystal thereof. However, short period superlattice comprising the above short period superlattices 125 and 127, and the indium gallium nitride pseudo-mixed crystal sensitizer layer 123 does not require to be homogeneously mixed in the growth thereof. That is, inventors found that InN/GaN short period superlattice was formed with extremely stable structure by effectively using the immiscibility.

Furthermore, growth processes of self-order and self-stop, which are different that of conventional growth of crystal, can be possible by the immiscibility being effectively functioned, so that an ultrathin film structure is easily controlled within molecular layer order of InN and GaN.

Inventors found that growth temperature of InN, for example, was limited to about 600° C. or less by a molecular beam epitaxy (MBE) method, however growth temperature could be possible at 600° C. or more by molecular layer order of an ultrathin film of InN. The crystal property of InN/GaN short period superlattice is extremely enhanced.

That is, in the n-type indium gallium nitride pseudo-mixed crystal layer 122, the p-type indium gallium nitride pseudo-mixed crystal layer 124 and the indium gallium nitride pseudo-mixed sensitizer layer 123, i.e., in at least a portion thereof or in preferably all thereof, by constantly maintaining layer thickness ratio of InN and GaN for InN/GaN short period superlattice, the pseudo-lattice matched structure of InN/GaN short period superlattice enables lattice defect to be suppressed. Furthermore, by enhancement of crystal property owing to high temperature growth, high conversion efficiency can be possible without deteriorating element property of the solar cell.

Figure 14:
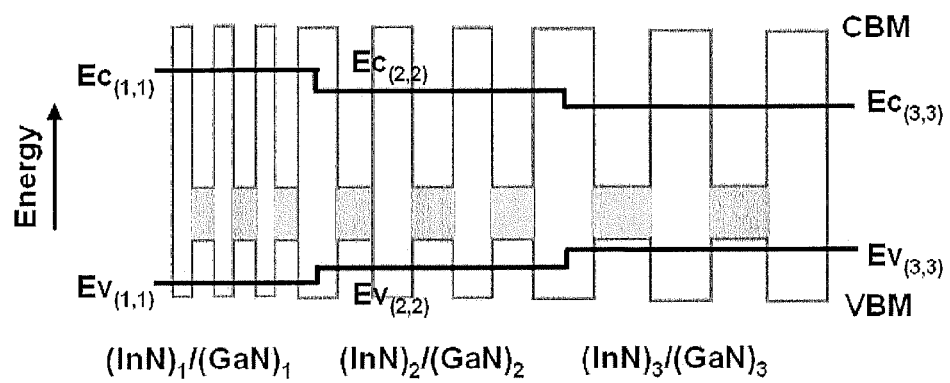
FIG. 14 is a schematic diagram showing an example of band line-up of an n-type indium gallium nitride pseudo-mixed crystal layer and p-type indium gallium nitride pseudo-mixed crystal layer according to a modification of a third embodiment of the present invention.

Next, an oblique band type carrier traveling layer which is a characteristic of the solar cell 120 is described. FIG. 14 is a schematic diagram showing an example of band line-up of a carrier traveling layer in solar cell according to the third embodiment of the present invention. In FIG. 14, example of the carrier traveling layer comprising: one molecular layer of InN (1 ML—InN)/one molecular layer of GaN (1 ML—

GaN) short period superlattice (hereinafter referred to as $(InN)_1/(GaN)_1$) maintaining layer thickness ratio of InN and GaN, i.e., InN:GaN=1:1; two molecular layers of InN (2 ML—InN)/two molecular layers of GaN (2 ML—GaN) short period superlattice (hereinafter referred to as $(InN)_2/(GaN)_2$); and three molecular layers of InN (3 ML—InN)/ three molecular layers of GaN (3 ML—GaN) short period superlattice (hereinafter referred to as $(InN)_3/(GaN)_3$). CBN and VBM refer to conduction band bottom portion and valence band top portion of the sensitizer layer, respectively. Energy is increasing from bottom side to top side in FIG. 9. Wide band gap is corresponding to GaN and narrow band gap is corresponding to InN. Furthermore, $E_{c(1,1)}$ refers to effective conduction band bottom portion of $(InN)_1/(GaN)_1$, $E_{c(2,2)}$ refers to effective conduction band bottom portion of $(InN)_2/(GaN)_2$, and $E_{c(3,3)}$ refers to effective conduction band bottom portion of $(InN)_3/(GaN)_3$, respectively. Meanwhile, $E_{v(1,1)}$ refers to effective valence band top portion of $(InN)_1/(GaN)_1$, $E_{v(2,2)}$ refers to effective valence band top portion of $(InN)_2/(GaN)_2$, and $E_{v(3,3)}$ refers to effective valence band top portion of $(InN)_3/(GaN)_3$, respectively.

A first characteristic of the carrier traveling layer in FIG. 14 is that average lattice constant is constantly maintained, since layer thickness ratio of the ultrathin film of InN and the ultrathin film of GaN is constant. That is, since pseudo-lattice matched system is formed, introduction of lattice defect can be suppressed.

A second characteristic of the carrier traveling layer is that band gap energy is continuously and stepwisely varied by changing layer thickness of the short period superlattice within the carrier traveling layer. For example, based on the theoretical simulation, band gap energy difference of $(InN)_1/(GaN)_1$ and $(InN)_2/(GaN)_2$ (i.e., difference of $E_{c(1,1)}-E_{v(1,1)}$ and $E_{c(2,2)}-E_{v(2,2)}$) is about 110 meV, and band gap energy difference of $(InN)_2/(GaN)_2$ and $(InN)_3/(GaN)_3$ (i.e., difference of $E_{c(2,2)}-E_{v(2,2)}$ and $E_{c(3,3)}-E_{v(3,3)}$) is about 140 meV.

The potential difference enhances carrier transport efficiency for the n-type indium gallium nitride pseudo-mixed crystal layer 122 and the p-type indium gallium nitride pseudo-mixed crystal layer 124. Especially, the potential difference is preferable for enhancing carrier absorption of hole having short carrier expansion length.

Figure 15:
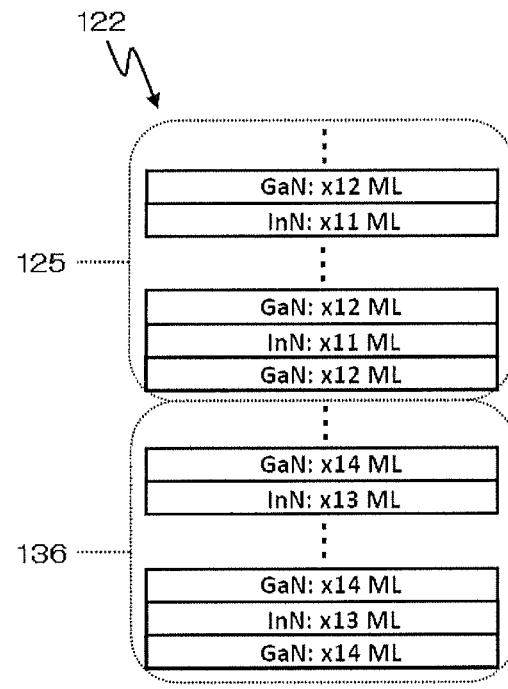
FIG. 15 is a block diagram showing an example of an n-type indium gallium nitride pseudo-mixed crystal layer according to a modification of a third embodiment of the present invention.

FIG. 15 is a block diagram of an example showing the n-type indium gallium nitride pseudo-mixed crystal layer 122 in the solar cell according to the third embodiment. In FIG. 15, the n-type indium gallium nitride pseudo-mixed crystal layer 122 comprises the short period superlattice 136 of the bottom layer 126. This corresponds to the carrier traveling layer mentioned in FIG. 14. By making suitable layer thickness of the short period superlattice, transporting efficiency of electron can be enhanced while the lattice defect serving as coherent structure is suppressed.

Figure 16:
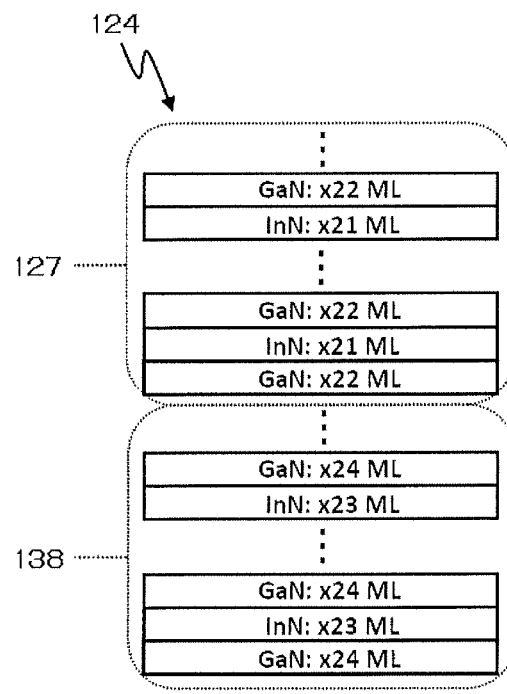
FIG. 16 is a block diagram showing an example of a p-type indium gallium nitride pseudo-mixed crystal layer according to a modification of a third embodiment of the present invention.

FIG. 16 is a block diagram of an example showing the p-type indium gallium nitride pseudo-mixed crystal layer 124 in the solar cell according to the third embodiment. In FIG. 16, the p-type indium gallium nitride pseudo-mixed crystal layer 124 comprises the short period superlattice 138 of the bottom layer 128. This corresponds to the carrier traveling layer mentioned in FIG. 14. By making suitable layer thickness of the short period superlattice, transporting efficiency of hole can be enhanced while the lattice defect serving as coherent structure is suppressed.

Figure 17:
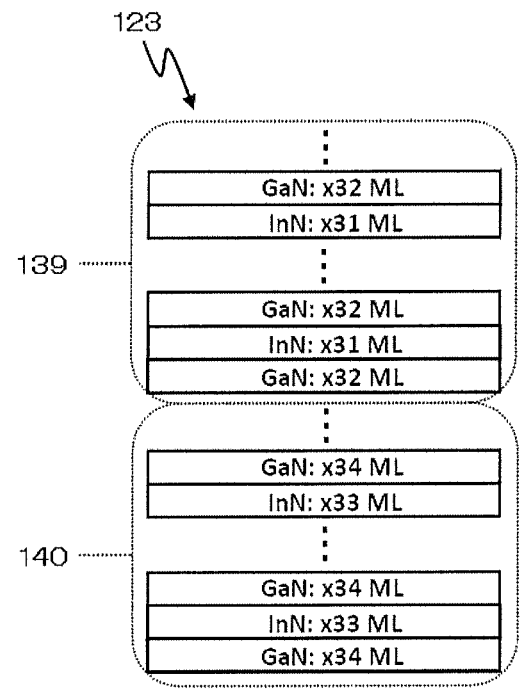
FIG. 17 is a block diagram showing an example of a sensitizer layer according to a modification of a third embodiment of the present invention.

FIG. 17 is a block diagram of an example showing the indium gallium nitride pseudo-mixed crystal sensitizer layer 123 in the solar cell according to the third embodiment. In FIG. 17, the indium gallium nitride pseudo-mixed crystal sensitizer layer 123 comprises the short period superlattices 139 and 140. This corresponds to the carrier traveling layer mentioned in FIG. 14. By making suitable layer thickness of the short period superlattice, transporting efficiency of carrier into the sensitizer layer can be enhanced while the lattice defect serving as coherent structure is suppressed.

As mentioned above, in the n-type indium gallium nitride pseudo-mixed crystal layer 122, the p-type indium gallium nitride pseudo-mixed crystal layer 124 and the indium gallium nitride pseudo-mixed crystal sensitizer layer 123, i.e., in a portion thereof or preferably in all thereof, by constantly maintaining layer thickness ratio of InN and GaN for InN/GaN short period superlattice, the pseudo-lattice mismatched structure of InN/GaN short period superlattice enables lattice defect to be suppressed. Thus, high conversion efficiency can be possible without deteriorating element property of the solar cell.

As mentioned in the third embodiment, InN/GaN short period superlattice, the n-type indium gallium nitride pseudo-mixed crystal layer 122, the indium gallium nitride pseudo-mixed crystal sensitizer layer 123 and the p-type indium gallium nitride pseudo-mixed crystal layer 114 not only may be a layered structure where the ultrathin film of InN and the ultrathin film of GaN are artificially layered by turns but also may be spontaneous metastable nano-structure (i.e., natural superlattice) by treatments such as thermal treatment, laser irradiation or electron beam irradiation. According to this configuration, lattice defect serving as a characteristic of coherent structure can be suppressed.

In the third embodiment, the indium gallium nitride pseudo-mixed crystal sensitizer layer 123 is one layer. It may also be multilayer. Furthermore, it may be a configuration having modulated doping which changes carrier density of a region adjacent to the indium gallium nitride pseudo-mixed crystal sensitizer layer 123.

Furthermore, the third embodiment mentioned an example of InN/GaN short period superlattice. However, it is not limited thereto. For example, a short period superlattice by indium gallium nitride aluminum (hereinafter refers to $In_xGa_yAl_{1-x-y}N$, wherein $0 \leq x$, $y \leq 1$), and a configuration of p-n junction according to $In_xGa_yAl_{1-x-y}N$ pseudo-mixed crystal and the sensitizer layer can be used. According to this configuration, Width of band gap energy of $In_xGa_yAl_{1-x-y}N$ is arbitrarily varied by changing mixed crystal ratio of x and y.

Figure 18:
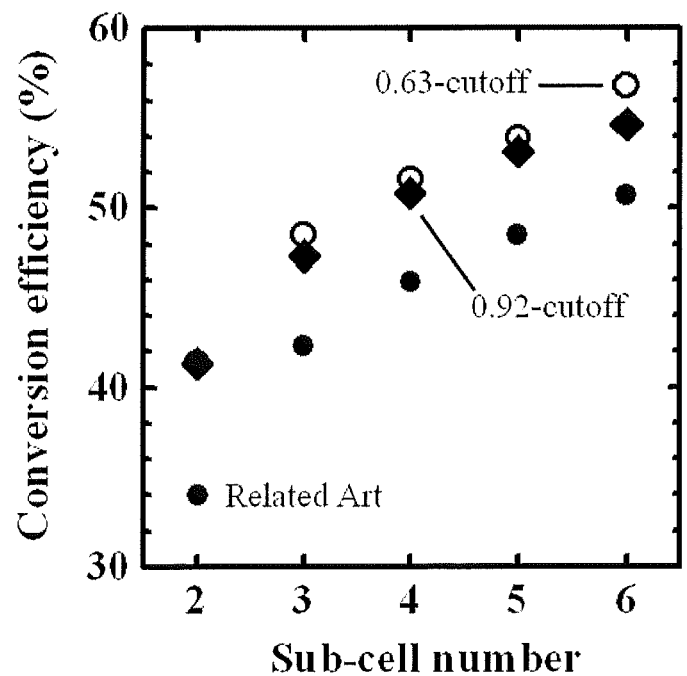
FIG. 18 is a graph showing theoretical maximum conversion efficiency with respect to number of cells according to a tandem-type solar cell of the present invention.

Next, conversion efficiency of the tandem-type solar cell according to the present invention is described with reference to FIG. 18. A graph showing theoretical maximum conversion efficiency with respect to number of cells for the tandem-type solar cell according to the present invention is shown in FIG. 18. The irradiation solar light is AM 1.5 spectrum shown in FIG. 5 and the source of data is standard spectrum using "ASTM G173-03 Reference Spectra Derivied from SMARTS v.2.9.2".

In FIG. 18, white circle (○) and dark diamond (◆) are theoretical maximum conversion efficiencies in the tandem-type solar cell according to the present invention. In case of absorption (0.63-cutoff) in interband transition, the white circle (○) is up to 0.63 eV (1968 nm of wavelength), and in case of absorption (0.92-cutoff) in interband transition, the dark diamond (◆) is up to 0.92 eV (1352 nm of wavelength). Meanwhile, dark circle (●) is theoretical maximum conversion efficiency for the tandem-type solar cell disclosed in patent reference 1, and is described as reference data for supporting superiority over the conventional technique.

For example, in four cells, theoretical maximum conversion efficiency is about 51.6% in 0.63-cutoff with respect to white circle (○) for the present invention, whereas theoretical maximum conversion efficiency is about 45.9% with respect to dark circle (●) for the conventional technique. Photoelectric conversion efficiency for the tandem-type solar cell according to the present invention is more than that of the conventional technique. This can be explained by using light with longer wavelength without reducing electric voltage generation for photothermal sensitizing effect.

Furthermore, the tandem structure mentioned in the second embodiment, i.e., conversion efficiency of 0.92-cutoff compares favorably with that of 0.63-cutoff. By combination of photothermal effect and mixed crystal composition ratio, generation of lattice defect for the tandem-type solar cell is suppressed. In indium nitride and indium gallium nitride mixed crystal with high indium composition, problem of p-type conductivity control is also avoided. The solar cell having high photoelectric conversion efficiency is provided and shows remarkable superiority in the present invention which is not expected in a conventional technique.

Furthermore, since number of photons used in intraband transition is increasing in 0.92-cutoff compared to 0.63-cutoff, photothermal effect is more facilitated.

The tandem-type solar cell of the present invention operates preferably in the environment of light focusing. This is because oblique irradiation of solar light by a condensing lens allows intraband absorption of light serving as elementary process of photothermal effect. This is also because heating by light focusing facilitates carrier thermal excitation.

As mentioned above, according to the above embodiment, generation of lattice defect for the tandem-type solar cell is suppressed. In indium nitride and indium gallium nitride mixed crystal with high indium composition, problem of p-type conductivity control is also avoided, thereby providing the solar cell having high photoelectric conversion efficiency.

(A Fourth Embodiment)

Figure 19:
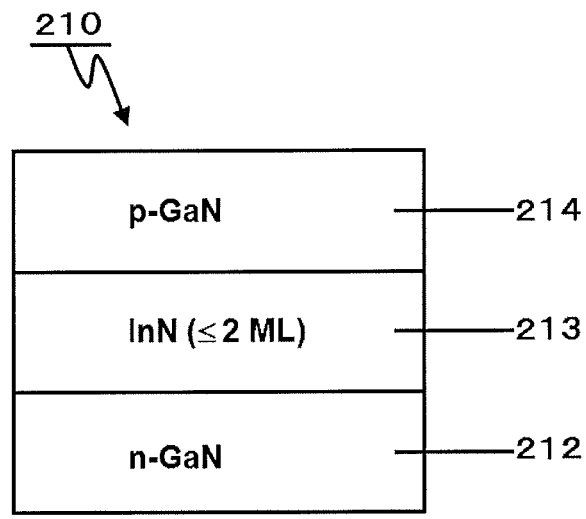
FIG. 19 is a block diagram showing an example of a solar cell according to a fourth embodiment of the present invention.

A photosensitizer layer for a fourth embodiment of the present invention is described with reference to FIGS. 19 and 20. FIG. 19 is a block diagram showing an example of a solar cell 210 according to the fourth embodiment. In FIG. 19, the solar cell 210 is provided with: an n-type gallium nitride (hereinafter referred to n-GaN) layer 212; a indium nitride (hereinafter referred to InN) photosensitizer layer 213 formed on the n-GaN layer 212; a p-type gallium nitride (hereinafter referred to p-GaN) layer 214 formed on the InN photosensitizer layer 213; an n-type electrode not displayed and electrically connected to the n-GaN layer 212; and a p-type electrode not displayed and electrically connected to the p-GaN layer 214.

The n-GaN layer 212 is used for separating electron and hole pair generated by photoelectric conversion and for transmitting electron to the n-type electrode. The p-GaN layer 214 is used for separating electron and hole pair generated by photoelectric conversion and for transmitting hole to the p-type electrode. Thus, each resistivity and layer thickness of the n-GaN layer 212 and the p-GaN layer 214 is preferably adjusted to efficiently perform carrier transportation.

The InN photosensitizer layer 213 is used for photosensitizing effect which facilitates not only light corresponding to band gap energy of gallium nitride forming p-n junction but also longer wavelength light in photoelectric conversion. As described below, a solar cell can be configured with high conversion efficiency to enhance photovoltaic force from the solar cell by the InN photosensitizer layer 123. The n-type electrode and the p-type electrode being not displayed are used for taking out photovoltaic power.

As the InN photosensitizer layer 213 according to the fourth embodiment in FIG. 19 is produced, InN is generally produced on GaN by a conventional semiconductor manufacturing method. For example, when crystal growth is performed along c-plane, since InN and GaN has about 11% of lattice mismatch, lattice defect of high density is introduced in a crystal growth. The lattice defect remarkably deteriorates photoelectric conversion efficiency. Inventors found that elastic deformation was maintained without lattice defect being introduced to InN, and an upper limit of film thickness, which was capable of coherent growing with respect to GaN, i.e., the critical film thickness, was two molecular layers (2 ML).

Since InN and GaN are immiscible, homogeneous mixed crystal composition is difficult to be realized in InGaN serving as mixed crystal thereof. Moreover, crystal property is deteriorated due to increase in indium composition. However, inventors found that in the ultrathin film of InN less than or equal to the above mentioned two molecular layers (2 ML), immiscibility of InN and GaN was effectively functioned and the crystal growth excellent in stable structure was realized. Due to this, processes of self-order and self-stop are possible, thereby forming steep InN/GaN interface of atomic layer order. A photoelectric conversion device essentially avoiding problems about non-uniform composition is prepared by forming InN/GaN binary system of an ultrathin film of pseudo-mixed crystal.

Inventors also found that growth temperature of InN was limited to about 600° C. or less by a molecular beam epitaxy (MBE) method, however growth temperature could be possible at 600° C. or more in the ultrathin film of InN having two molecular layers or less. Crystal property of the ultrathin film of InN is extremely enhanced. Thus, unlike conventional InN, the ultrathin film of InN shows specific property and high photoelectric conversion efficiency (internal quantum efficiency) is realized.

Figure 20:
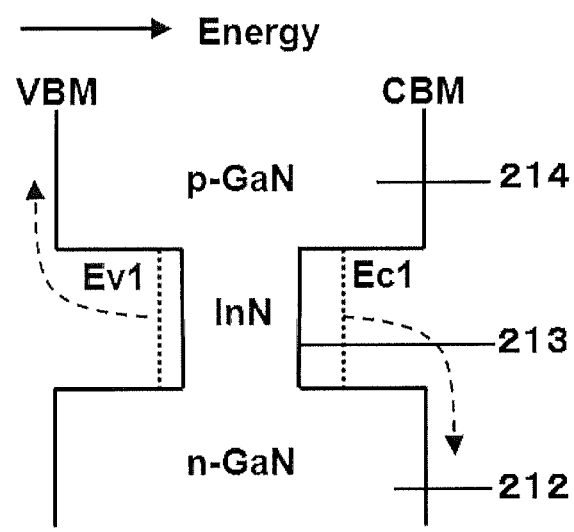
FIG. 20 is a schematic diagram showing band line-up of GaN and InN.

FIG. 20 is a schematic diagram showing band line-up of GaN and InN. In FIG. 20 as well as in FIG. 19, the InN photosensitizer layer 213 is sandwiched between the n-GaN layer 212 and the p-GaN layer 214. CBM and VBM refer to conduction band bottom portion and valence band top portion of GaN and InN, respectively. Energy is increasing from left side to right side in FIG. 20.

Band gap energies of InN and GaN are about 0.63 eV and 3.4 eV at room temperature, respectively. Conduction band offset is about 2 eV and valence band offset is about 0.75 eV. Since photo-excited carrier is almost confined in the InN layer, this large potential barrier cannot take carrier into the GaN layer.

Meanwhile, when thickness of the InN layer is thinned down up to nanometer scale, according to quantum-mechanical effect, each quantum level of $E_{c1}$ and $E_{v1}$ of electron and hole is formed in an energy position of a dotted line in FIG. 20. Namely, according to the quantum size effect, effective band gap energy (difference of $E_{c1}$ and $E_{v1}$) of InN shifts from 0.63 eV. For example, inventors found that effective band gap energy of two molecular layers (2 ML) of InN was lower than band gap energy of 3.4 eV of GaN as much as 500 meV, and effective band gap energy of one molecular layer (1 ML) of InN was lower than band gap energy of 3.4 eV of GaN as much as 200 meV.

In InN/GaN quantum well structure of one molecular layer to two molecular layers, potential barrier where carrier feels in InN well layer, as mentioned above, is about 500 meV in two molecular layers of InN, and is about 200 meV in one molecular layer, respectively. Values thereof are largely decreased compared to band offset of a conventional InN and GaN. Even in thermal excitation process at room temperature, carrier can partially move from the InN photosensitizer layer 213 to the n-GaN layer 212 and the p-GaN layer 214.

Furthermore, for example, by intraband transition process of light absorbing, which is less than 0.63 eV of photon energy and is not absorbed even in InN, carrier movement is facilitated from the InN photosensitizer layer 213 to the n-GaN layer 212 and the p-GaN layer 214. In solar light spectrum, for example in AM 1.5 spectrum, a spectrum region less than 0.63 eV cannot be missed. Irradiation power density of about 4% and photon density of 9% exist.

That is, by allowing layer thickness of the InN photosensitizer layer 213 to be two molecular layers or less and by thermal excitation or for example, intraband transition of light absorbing of less than 0.63 eV, carrier generated by interband absorption in the InN photosensitizer layer 213 moves to the n-GaN layer 212 and the p-GaN layer 214. Thus, photosensitizing effect is realized.

A photosensitizing effect enhances operation property of the solar cell. For example, when absorption energy of InN/GaN quantum well is compared to InGaN p-n junction, since absorbable number of photons is same, short circuit current is also same. However, since carrier overcomes potential barrier of about 200 meV, an open circuit voltage is increased by the above photosensitizing effect.

From the above, the solar cell 210 according to the fourth embodiment absorbs light corresponding to effective band gap energy of the InN photosensitizer layer 213. Thus, photovoltaic force can be enhanced by photosensitizing effect. Light serving as photon energy less than 0.62 eV of transmission loss can be used, thereby facilitating the solar cell with high electric power.

The fourth embodiment mentioned an example according to p-n junction of GaN. However, the embodiment is not limited thereto. For example, it includes a configuration of p-n junction of indium gallium nitride aluminum (hereinafter refers to $In_xGa_yAl_{1-x-y}N$, wherein $0 \leq x, y \leq 1$). According to this configuration, width of band gap energy of $In_xGa_yAl_{1-x-y}N$ is arbitrarily varied by changing the mixed crystal ratio of x and y. Since effective band gap energy of the ultrathin film of InN having thickness layer of two molecular layer or more also becomes small like several hundreds meV, while the photosensitizing effect being maintained, efficiency of the solar cell can be enhanced.

The fourth embodiment mentioned an example of p-n junction of GaN. Moreover, the embodiment may also be a configuration of InN and GaN short period superlattices, i.e., p-n junction of InN/GaN pseudo-mixed crystal. According to this configuration, by layer thickness control of InN and GaN, effective band gap of InN/GaN pseudo-mixed crystal can be varied.

Furthermore, as shown in FIGS. 19 and 20, the fourth embodiment mentioned that the photosensitizer layer 213 was only one layer. However, for example a configuration having multilayer structure may be possible where plural sensitizer layers 213 are inserted. According to this configuration, in accordance with increase in number of layers of the plural inserted InN photosensitizer layers 213, light absorption is increased. Thus, the photothermal sensitizing effect can be strengthened. In this case, multilayer structure of the photosensitizer layer 213 protruding from a depletion region of the p-n junction interface may be used.

Furthermore, when the InN photosensitizer layer 213 are both single layer and multilayer, the InN layer may be sandwiched or may be capped by a non-doped GaN (hereinafter refers to i-GaN) layer. According to this configuration, a depletion region of p-n junction interface can be preferably controlled.

(A Fifth Embodiment)

The fourth embodiment mentioned the solar cell wherein the ultrathin film of InN is inserted into the p-n junction by GaN. In order to fabricate a highly efficient solar cell, a tandem structure suitable for wide range of solar light spectrum is useful. Thus, when $In_xGa_yAl_{1-x-y}N$ of the modified example according to the fourth embodiment is applied to the p-n junction, width of band gap energy is required to be the range from 6.2 eV to 0.63 eV. Each solar cell has different width of energy band gap.

Each solar cell is also layered along a light direction propagated from a light receiving plane to be arranged from wide band gap energy to narrow band gap energy.

Figure 21:
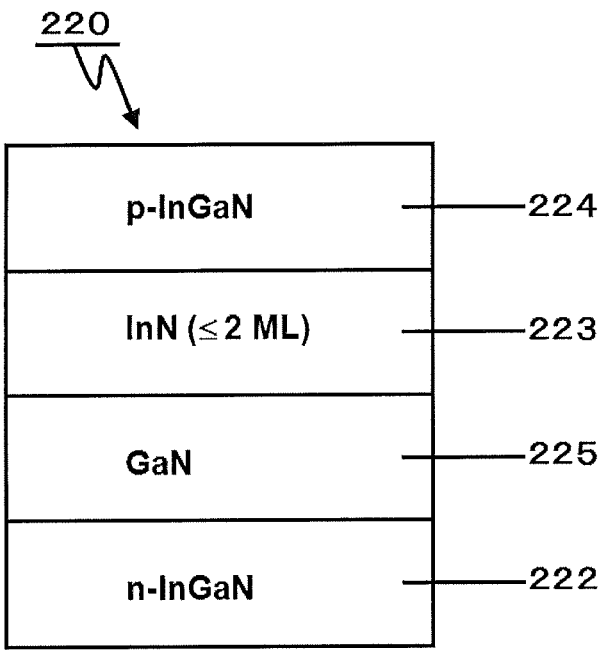
FIG. 21 is a block diagram showing an example of a cell according to a tandem-type solar cell of a fifth embodiment of the present invention.
Figure 22:
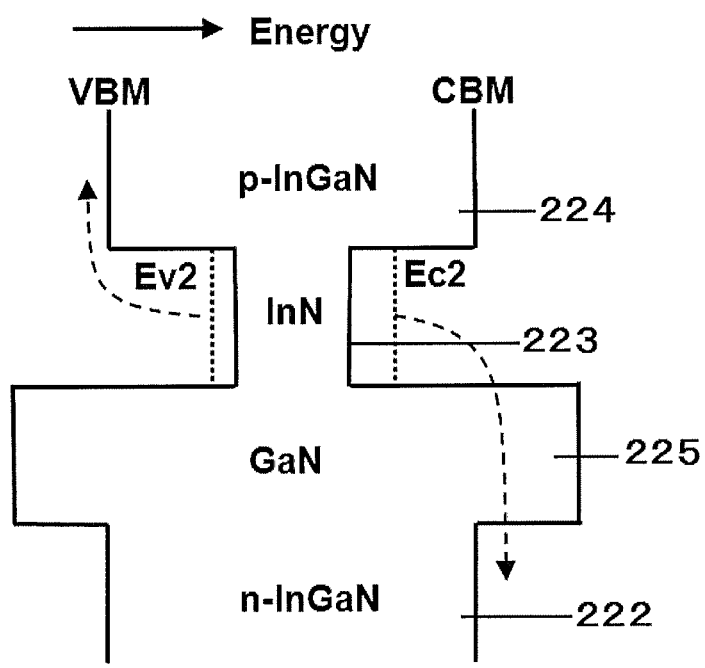
FIG. 22 is a schematic diagram showing band line-up of GaN, InGaN, and InN.

In the fifth embodiment, as an example of the solar cell, while referring to FIGS. 21 and 22, the solar cell is described wherein the ultrathin film of InN is inserted into the p-n junction by InGaN.

FIG. 21 is a block diagram of an example of a solar cell 220 comprising the tandem-type solar cell according to the fifth embodiment. In FIG. 21, the solar cell 220 is provided with: an n-type indium gallium nitride (hereinafter referred to n-InGaN) layer 222; a gallium nitride (hereinafter referred to GaN) layer 225 formed on the n-InGaN layer 222; a indium nitride (InN) photosensitizer layer 223 formed on the GaN layer 225; and a p-type indium gallium nitride (hereinafter referred to p-InGaN) layer 224 formed on the InN photosensitizer layer.

The n-InGaN layer 222 is used for separation of electron and hole pair generated by photoelectric conversion and for electron transmission. The p-InGaN layer 224 is used for separation of electron and hole pair generated by photoelectric conversion and for hole transmission. Thus, each resistivity and layer thickness of the n-InGaN layer 222 and the p-InGaN layer 224 is preferably adjusted to perform efficient carrier transportation. Moreover, in the band gap energies of the n-InGaN layer 222 and the p-InGaN layer 224, mixed crystal composition ratio thereof is preferably controlled to satisfy consistency with solar light spectrum, and further to satisfy electric current conservation law where each solar cell generates the same electric current for the tandem structure.

The InN photosensitizer layer 223 is used for the sensitizing effect which facilitates not only light corresponding to band gap energy of InGaN forming the p-n junction but also light with longer wavelength. As described below, solar cell can be configured with high conversion efficiency to enhance photovoltaic force from solar light by the InN photosensitizer layer 223.

The GaN layer 225 included in the solar cell 220 is described. Formation of the InN photosensitizer layer 223 uses processes of self-order and self-stop based on immiscibility with the bottom layer of GaN as described in the fourth embodiment. However, inventors found that when the p-n junction was formed in InGaN, that is, in the combination of InN and the bottom layer of InGaN, immiscibility was not sufficiently generated. As a specific example, the ultrathin film of InN by processes of self-order and self-stop was not found on InGaN with about 20% of indium composition (absorption end wavelength is corresponding to about 500 nm).

However, in order to facilitate the solar cell 220 for the tandem structure, indium composition ratio of the n-InGaN layer 222 and the p-InGaN layer 224 is required to be increased. This similarly corresponds to increase in indium composition ratio of x in the case where the p-n junction comprises $In_xGa_yAl_{1-x-y}N$. Thus, when the InN photosensitizer layer 223 is directly formed on the n-InGaN layer 222, since immiscibility is suppressed, obtaining perfect structure is difficult.

In order to solve the above problem, the GaN layer 225 is inserted between the n-InGaN layer 222 and the InN photosensitizer layer 223 to use immiscibility of InN. This is important point of the fifth embodiment. According to this configuration, immiscibility between the InN photosensitizer layer 223 and the GaN layer 225 is generated, thereby facilitating formation of the ultrathin film of InN by processes of self-order and self-stop. Thus, the ultrathin film of InN with high performance is obtained.

FIG. 22 is a schematic diagram showing band line-up of GaN, InGaN, and InN. In FIG. 22 as well as in FIG. 21, the InN photosensitizer layer 223 and the GaN layer 225 are sandwiched by the n-InGaN layer 222 and the p-InGaN layer 224. CBN and VBM refer to conduction band bottom portion and valence band top portion of GaN, InGaN, and InN, respectively. Energy is increasing from left side to right side in FIG. 22. Effective band gap energy of the InN photosensitizer layer 223 is corresponding to difference of quantum levels of $E_{c2}$ and $E_{v2}$ of electron and hole.

In the fifth embodiment, in order to the InN photosensitizer layer 223 obtaining photosensitizing effect, by carrier thermal excitation at room temperature, for example by intraband transition of light absorption less than 0.63 eV of photon energy which is not absorbed even in InN, carrier is required to be moved from the InN photosensitizer layer 223 to the n-InGaN layer 222 and the p-InGaN layer 224.

By a configuration wherein film thickness of the InN photosensitizer layer 223 is equal to or less than two molecular layers, potential barrier of the n-InGaN layer 222 and the p-InGaN layer 224 is about several hundreds meV. This is equal to or less than the case of the fourth embodiment. That is, when film thickness of the InN photosensitizer layer 223 is one molecular layer, the potential barrier is 200 meV or less, and when film thickness of the InN photosensitizer layer 223 is two molecular layers, the potential barrier is 500 meV or less. These potential barriers are decreasing in accordance with increase in indium composition ratio of the n-InGaN layer 222 and the p-InGaN layer 224. In view of energy, carrier moves from the InN photosensitizer layer 223 to the n-InGaN layer 222 and the p-InGaN layer 224. Thus, it is considered that photosensitizing effect is due to the InN photosensitizer layer 223.

In this manner, there is no problem in a movement of hole from the InN photosensitizer layer 223 to the p-InGaN layer 224. However, in view of an electron movement to the n-InGaN layer 222, as shown in FIG. 22, the GaN layer 225 may be potential barrier preventing the electron movement.

In order to solve this problem, that is, in order to electrically connect the n-InGaN layer 222 with the InN photosensitizer layer 223, layer thickness of the GaN layer 225 becomes up to ultrathin film thickness, wherein electron can be quantum-mechanical tunneling. For example, layer thickness of the GaN layer 225 is 10 nm or less, and is more preferably four molecular layers or less.

In this manner, layer thickness of the InN photosensitizer layer 223 is to be two molecular layers and the GaN layer 225 is to be an ultrathin film. Carrier generated by interband absorption in the InN photosensitizer layer 223 is transited into the n-InGaN layer 222 and the p-InGaN layer 224 by intraband transition using thermal excitation or for example, using light absorption of less than 0.63 eV.

Photosensitizing effect enhances operation property of the solar cell. Compared to InGaN p-n junction serving as the same basic absorption end, absorbable number of photons is same. As a result, short circuit current is the same. However, by photosensitizing effect, carrier overcoming potential barrier of several hundreds meV can be used. Thus, an open circuit voltage is increasing. This contributes increase in conversion efficiency of the solar cell.

As mentioned above, the solar cell 220 comprising the tandem-type solar cell according to the fifth embodiment absorbs light corresponding to effective band gap energy of the InN photosensitizer layer 223. Photovoltaic force is increased by photosensitizing effect. Light serving as photon energy less than 0.63 eV of transmittance loss can be used, thereby obtaining the solar cell with high electric power.

The fifth embodiment mentioned a configuration of the p-n junction of InGaN. However, the embodiment is not limited thereto. For example, it may include a configuration of a p-n junction of indium gallium nitride aluminum (hereinafter refers to $In_xGa_yAl_{1-x-y}N$, wherein $0 \le x$, $y \le 1$). According to this configuration, width of band gap energy of $In_xGa_yAl_{1-x-y}N$ is arbitrarily varied by changing the mixed crystal ratio of x and y. Since effective band gap energy of the ultrathin film of InN having thickness layer of two molecular layers or more is less than band gap energy of $In_xGa_yAl_{1-x-y}N$ as much as several hundreds meV, while photosensitizing effect being maintained, efficiency of the solar cell can be enhanced.

The fifth embodiment mentioned an example of the p-n junction of InGaN. However, as described below, the embodiment may include a configuration of a p-n junction of short period superlattice, i.e., InN/GaN pseudo-mixed crystal. According to this configuration, by controlling layer thicknesses of InN and GaN, effective band gap of InN/GaN pseudo-mixed crystal can be varied.

As shown in FIGS. 21 and 22, the fifth embodiment mentioned an example of the InN photosensitizer layer 223 having only one layer. For example, the embodiment may include multiple layers of the inserted InN photosensitizer layer 223. According to this configuration, light absorption is increasing in accordance with number of layers of the inserted the InN photosensitizer layer 223. Thus, photosensitizing effect is strengthened. In this case, multilayer structure of the InN photosensitizer layer 223 protruding from a depletion region of p-n junction interface may be used.

Furthermore, when the InN photosensitizer layer 223 is both single layer and multilayer, the InN layer may be sandwiched or may be capped by a non-doped InGaN (hereinafter refers to i-InGaN) layer. According to this configuration, a depletion region of p-n junction interface can be preferably controlled.

(A Sixth Embodiment)

In the fourth and fifth embodiments, examples of the solar cells having the photosensitizing effect were described. In the sixth embodiment, a tandem-type solar cell comprising the above solar cell is described with reference to FIGS. 1, 18, 23-26.

Patent reference 1 disclosed that the end cell of a tandem structure comprised a configuration of InN cell absorbing light with the longest wavelength to use solar light spectrum as much as possible. However, inventors found that it was extremely difficult to control conductivity of InN, i.e., to form an InN p-n junction and it was unsuitable to form the solar cell with high efficiency.

Instead of using wide range of solar light spectrum as much as possible, inventors researched useful method of utilizing solar light spectrum without damaging conversion efficiency of the solar cell.

FIG. 5 shows irradiation power density (gray color) and photon density (black color) with respect to wavelength. The source of data is standard spectrum using "ASTM G173-03 Reference Spectra Derived from SMARTS v.2.9.2".

As is shown in FIG. 5, in an infrared wavelength region of solar light, a wavelength loss region is found here and there due to absorption of moisture. Considering a spectrum discontinuity region without damaging conversion efficiency, interband absorption up to shorter wavelength as much as possible is used. That is, by reducing indium composition ratio of a InGaN p-n junction as much as possible, light of longer wavelength being not absorbed is used as intraband transition source of the above mentioned photosensitizing effect.

As a result, solar light spectrum composition up to 0.92 eV (1.35 μm of wavelength) was absorbed by interband transition, i.e., was used as electric current, thereby utilizing spectrum of longer wavelength as a intraband excitation source of the light sensitizer. When solar light spectrum up to 0.63 eV (1.97 μm of wavelength) was used as interband transition (hereinafter refers to 0.63-cutoff), photon number density was $5 \times 10^{21}$ $m^{-2}$ $s^{-1}$ $nm^{-1}$. However, when solar light spectrum up to 0.92 eV (1.35 μm of wavelength) was used as interband transition (hereinafter refers to 0.92-cutoff), photon number density was reduced to $3.0 \times 10^{21}$ $m^{-2}$ $s^{-1}$ $nm^{-1}$. In the tandem-type solar cell, since electric power contribution from the last end cell corresponding to longer wavelength is not large, entire conversion efficiency is not particularly damaged.

A tandem structure is described, wherein solar light up to 0.92 eV is used (0.92-cutoff) as interband transition. In the tandem-type solar cell, electric conversion law making constant electric current generation in each cell should be satisfied by matching solar light spectrum.

Figure 23:
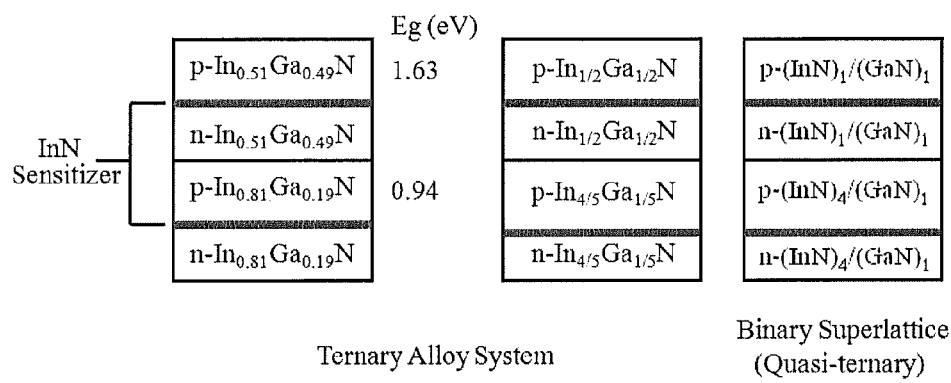
FIG. 23 is a block diagram showing an example of a tandem-type solar cell according to a sixth embodiment of the present invention.

FIG. 23 shows an example of a tandem-type solar cell comprising two cells. Each cell is provided with: an InGaN p-n junction; and an InN photosensitizer layer therebetween. The InN photosensitizer layer, as mentioned in the fifth embodiment, comprises ultrathin films of InN and GaN.

As the effect of InN photosensitizer layer is already mentioned, the dimension of the potential barrier with InGaN p-n junction is determined by "200×(gallium composition of InGaN) meV" and linear approximation of Vegard's law. For example, in case of being sandwiched by GaN p-n junction, the potential barrier is 200 meV and in case of being sandwiched by $In_{0.5}Ga_{0.5}N$ p-n junction, the potential barrier is 100 meV.

In order to satisfy electric current conservation law in two cells with respect to solar light spectrum up to 0.92 eV (1.35 μm of wavelength), as shown in left side of FIG. 23, band gap energies of InGaN p-n junctions are 1.63 eV and 0.94 eV. With respect to solar light spectrum up to 0.92 eV, band gap energy of InGaN is different from 0.92 eV in the second (the last) cell. This is explained by photosensitizing effect. In this case, the potential barrier is 0.02 eV.

At this time, indium compositions of InGaN mixed crystal corresponding to 1.63 eV and 0.94 eV are 0.51 and 0.81, respectively. These can be expressed by simple fractional equation. As shown in the center of FIG. 23, indium compositions thereof are approximated to $In_{1/2}Ga_{1/2}N$ and $In_{4/5}Ga_{1/5}N$, respectively. Generally, even though mixed crystal composition ratio is analogous value of zero or one, according to design rule of the tandem-type solar cell, the composition ratio can be expressed by simple fractional equation, i.e., discrete mixed crystal composition ratio.

This discrete mixed crystal composition ratio with fractional equation means that the tandem-type solar cell is configured by corresponding mixed crystal composition of short period binary superlattice, i.e., pseudo-mixed crystal (digital mixed crystal). As shown in right side of FIG. 23, for example $In_{1/2}Ga_{1/2}N$ is one molecular layer of InN (1 ML—InN) /one molecular layer of GaN (1 ML—GaN) binary superlattice (hereinafter refers to $(InN)_1/(GaN)_1$), and $In_{4/5}Ga_{1/5}N$ is four molecular layers of InN (4 ML—InN)/ one molecular layer of GaN (1 ML—GaN) binary superlattice (hereinafter refers to $(InN)_4/(GaN)_1$).

Figure 26:
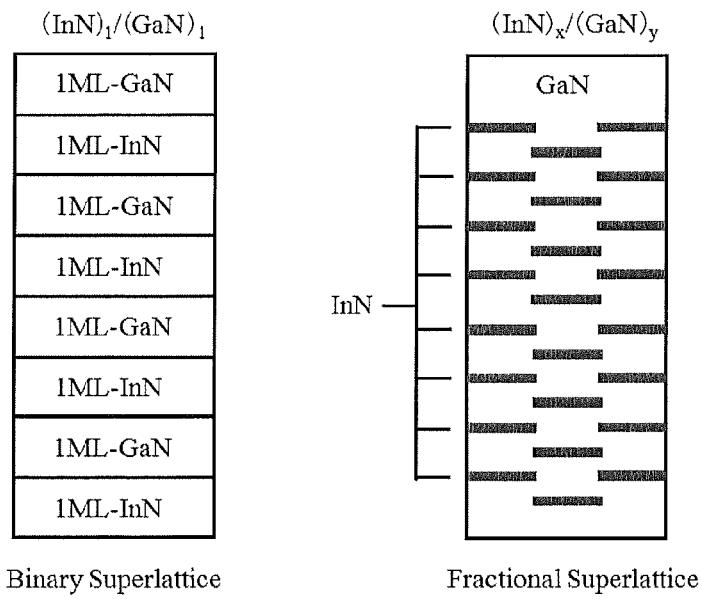
FIG. 26 is a block diagram showing an example of controlling mixed crystal composition ratio by pseudo-mixed crystal.
Figure 27:
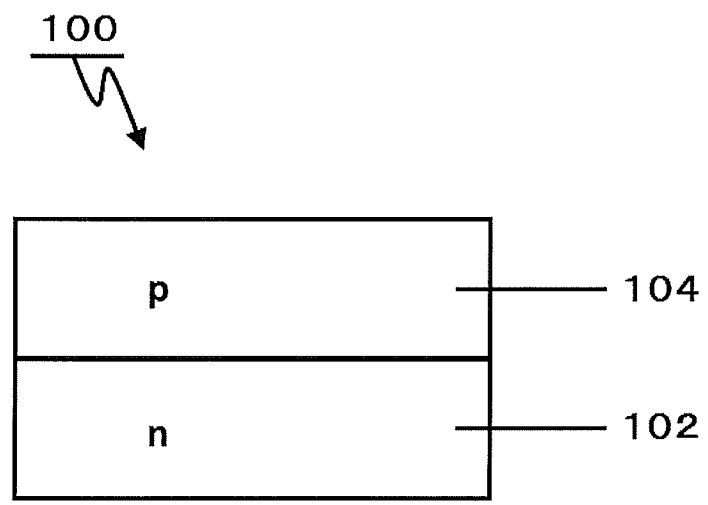
FIG. 27 is a block diagram showing an example of a solar cell according to a conventional technique.

Next, pseudo-mixed crystal is described. FIG. 26 is a block diagram showing control of mixed crystal composition ratio according to pseudo-mixed crystal. For example, pseudo-mixed crystal, as shown in left side of FIG. 26, refers that GaN and InN serving as binary chemical compound are layered by turns. Physical property thereof is approximately given as volume ratio of layered structure. That is, as shown in left side of FIG. 26, $(InN)_1/(GaN)_1$ corresponds to $In_{0.5}Ga_{0.5}N$.

Meanwhile, right side of FIG. 26 shows fractional equation superlattice, i.e., island nano-structure of InN being incorporated to GaN of host material. By suitably controlling size of island and distance between islands, physical property thereof is approximately given in volume ratio of material. That is, in right side of FIG. 26, since volume ratio is x:y, $In_{x/(x+y)}Ga_{y/(x+y)}$ is given. Whereas discrete mixed crystal composition ratio can continuously be complemented by InN/GaN superlattice pseudo-mixed crystal with fractional equation. Even though it is difficult to use only the discrete mixed crystal composition ratio, mixed crystal composition ratio can be arbitrarily configured by superlattice with fractional equation.

Figure 24:
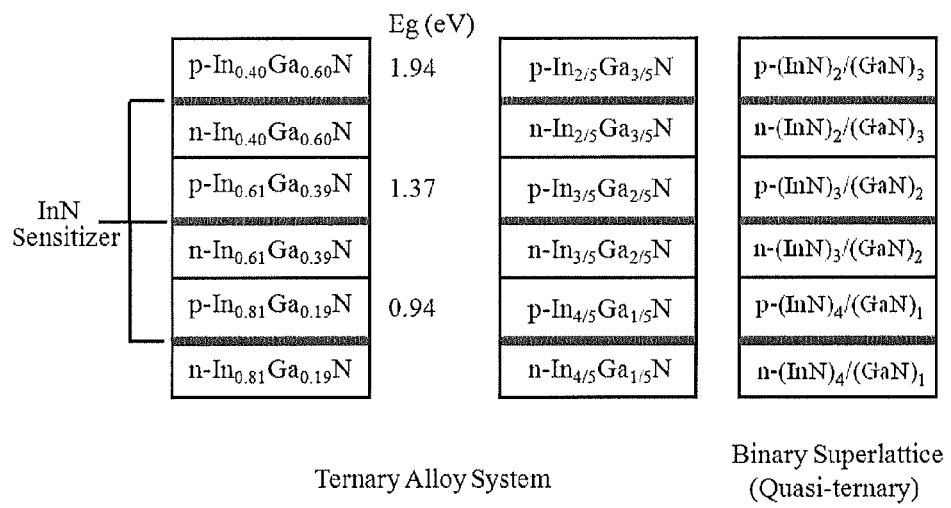
FIG. 24 is a block diagram showing an example of a tandem-type solar cell according to a sixth embodiment of the present invention.

FIG. 24 shows an example of a tandem-type solar cell comprising three cells. Each cell is provided with: an InGaN p-n junction; and an InN photosensitizer layer sandwiched therebetween.

In order to satisfy electric current conservation law in three cells with respect to solar light spectrum up to 0.92 eV (1.35 μm of wavelength), as shown in left side of FIG. 24, band gap energies of InGaN p-n junctions are 1.94 eV, 1.37 eV, and 0.94 eV, respectively.

At this time, indium compositions of InGaN mixed crystal corresponding to 1.94 eV, 1.37 eV, and 0.94 eV are 0.40, 0.61, and 0.81, respectively. These can be expressed by simple fractional equation. As shown in the center of FIG. 24, indium compositions thereof are approximated to $In_{2/5}Ga_{3/5}N$, $In_{3/5}Ga_{2/5}N$, and $In_{4/5}Ga_{1/5}N$, respectively. Generally, even though mixed crystal composition ratio is analogous value of zero or one, according to design rule of the tandem-type solar cell, the composition ratio can be expressed by simple fractional equation, i.e., discrete mixed crystal composition ratio.

This discrete mixed crystal composition ratio with fractional equation means that the tandem-type solar cell is configured by corresponding mixed crystal composition of short period binary superlattice, i.e., pseudo-mixed crystal (digital mixed crystal). As shown in right side of FIG. 7, for example $In_{2/5}Ga_{3/5}N$ is two molecular layers of InN (2 ML—InN) /three molecular layers of GaN (3 ML—GaN) binary superlattice (hereinafter refers to $(InN)_2/(GaN)_3$), $In_{3/5}Ga_{2/5}N$ is three molecular layers of InN (3 ML—InN)/ two molecular layers of GaN (2 ML—GaN) binary superlattice (hereinafter refers to $(InN)_3/(GaN)_2$), and $In_{4/5}Ga_{1/5}N$ is four molecular layers of InN (4 ML—InN)/one molecular layer of GaN (1 ML—GaN) binary superlattice (hereinafter refers to $(InN)_4/(GaN)_1$).

Figure 25:
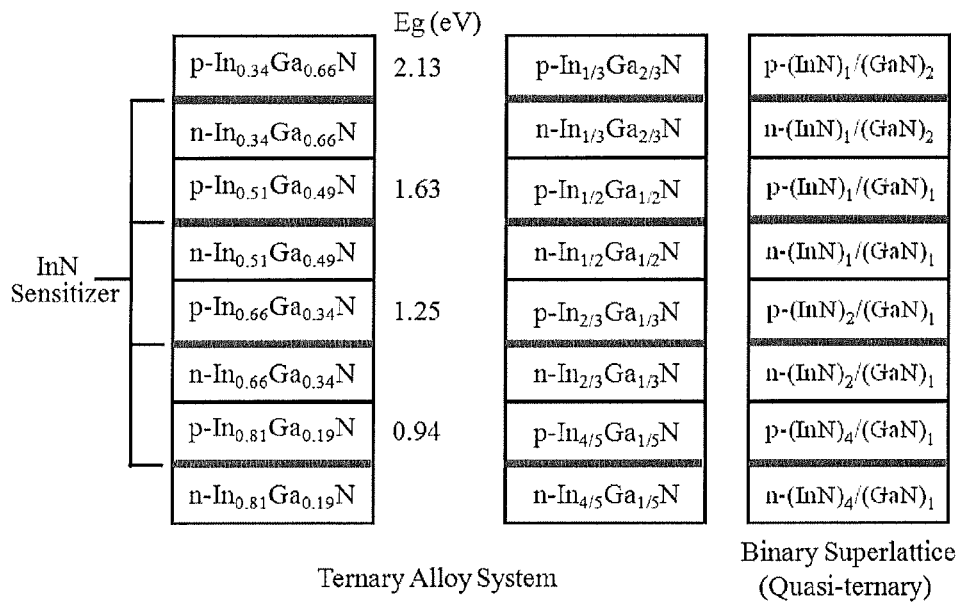
FIG. 25 is a block diagram showing an example of a tandem-type solar cell according to a sixth embodiment of the present invention.

FIG. 25 shows a configuration of a tandem-type solar cell comprising four cells. Each cell is provided with: an InGaN p-n junction; and an InN photosensitizer layer sandwiched therebetween.

In order to satisfy electric current conservation law in four cells with respect to solar light spectrum up to 0.92 eV (1.35 μm of wavelength), as shown in left side of FIG. 25, band gap energies of InGaN p-n junctions are 2.13 eV, 1.63 eV, 1.25 eV, and 0.94 eV, respectively.

At this time, indium compositions of InGaN mixed crystal corresponding to 2.13 eV, 1.63 eV, 1.25 eV, and 0.94 eV are 0.34, 0.51, 0.66, and 0.81, respectively. These can be expressed by simple fractional equation. As shown in the center of FIG. 25, indium compositions thereof are approximated to $In_{1/3}Ga_{2/3}N$, $In_{1/2}Ga_{1/2}N$, $In_{2/3}Ga_{1/3}N$, and $In_{4/5}Ga_{1/5}N$, respectively. Generally, even though mixed crystal composition ratio is analogous value of zero or one, according to design rule of the tandem-type solar cell, the composition ratio can be expressed by simple fractional equation, i.e., discrete mixed crystal composition ratio.

This discrete mixed crystal composition ratio with fractional equation means that the tandem-type solar cell is configured by corresponding mixed crystal composition of short period binary superlattice, i.e., pseudo-mixed crystal (digital mixed crystal). As shown in right side of FIG. 8, for example $In_{1/3}Ga_{2/3}N$ is one molecular layer of InN (1 ML—InN)/two molecular layers of GaN (2 ML—GaN) binary superlattice (hereinafter refers to $(InN)_1/(GaN)_2$), $In_{1/2}Ga_{1/2}N$ is one molecular layer of InN (1 ML—InN)/one molecular layer of GaN (1 ML—GaN) binary superlattice (hereinafter refers to $(InN)_1/(GaN)_1$), $In_{2/3}Ga_{1/3}N$ is two molecular layers of InN (2 ML—InN)/one molecular layer of GaN (1 ML—GaN) binary superlattice (hereinafter refers to $(InN)_2/(GaN)_1$), and $In_{4/5}Ga_{1/5}N$ is four molecular layers of InN (4 ML—InN)/one molecular layer of GaN (1 ML—GaN) binary superlattice (hereinafter refers to $(InN)_4/(GaN)_1$).

In order to satisfy electric current conservation law from two, three, and four tandem structures with respect to solar light spectrum up to 0.92 eV (1.35 μm of wavelength), any structure was found to be mixed crystal composition ratio with discrete fractional equation. As is clear from two and four tandem structures, even though number of tandem structures are multiples of two, three and four, mixed crystal composition ratio with discrete fractional equation can be shown. The mixed crystal composition ratio thereof is already mentioned suitable for forming InN/GaN pseudo-mixed crystal. Following effect is shown in InN/GaN pseudo-mixed crystal rather than in ternary InGaN mixed crystal.

InN and GaN have strong immiscibility. Crystal growth and composition control thereof are extremely difficult in medium indium composition and high indium composition which are required for the tandem-type solar cell. However, in the growth of binary InN/GaN pseudo-mixed crystal having a design of non-mixing, the immiscibility becomes reversely advantageous, thereby facilitating effective band gap or effective control of mixed crystal composition. That is, since the effect of variation of indium composition is largely suppressed, setting value of wavelength division for the tandem structure is completely reproduced. Moreover, in spite of high lattice mismatched system, by reciprocally compensating lattice distortion, lattice mismatch can be tolerated. Thus, generation of lattice defect is suppressed to reduce electric current leakage of the solar cell.

As often seen in other chemical compound semiconductor, so-called "distortion superlattice buffer effect" is expected. Generation of lattice defect due to lattice mismatch between cells accompanied by formation of tunneling junction of each cell is suppressed, thereby reducing electric current leakage of the solar cell.

By polarization effect shown in c-plane growth of nitride-based semiconductor, energy difference of band end position and level of donor or acceptor is decreasing, i.e., active energy of magnesium acceptor is reduced, thereby facilitating conductivity control, especially p-type conductivity control.

Conversion efficiency of the tandem-type solar cell according to the sixth embodiment is described with reference to FIG. 18. Theoretical maximum conversion efficiency with respect to number of cells for the tandem-type solar cell according to present invention is shown in FIG. 18. Irradiated solar light is AM 1.5 spectrum in FIG. 5 and the source of data is standard spectrum using "ASTM G173-03 Reference Spectra Derivied from SMARTS v.2.9.2".

In FIG. 18, white circle (○) and dark diamond (◆) are theoretical maximum conversion efficiency in the tandem-type solar cell according to the present invention. In case of absorption (0.63-cutoff) in interband transition, the white circle (○) is up to 0.63 eV (1.97 μm of wavelength), and in case of absorption (0.92-cutoff) in interband transition, the dark diamond (◆) is up to 0.92 eV (1.35 μm of wavelength).

Meanwhile, dark circle (●) is theoretical maximum conversion efficiency for the tandem-type solar cell disclosed in patent reference 1, and is described as reference data for supporting superiority over a conventional technique.

For example, in four cells, theoretical maximum conversion efficiency is about 51.6% in 0.63-cutoff with respect to white circle (○) and is about 50.8% in 0.92-cutoff with respect to dark diamond (◆) for the present invention, whereas theoretical maximum conversion efficiency is about 45.9% with respect to dark circle (●) for a conventional technique. Photoelectric conversion efficiency for the tandem-type solar cell according to the present invention is more than that of a conventional technique. This is because light with longer wavelength can be used without reducing photovoltaic force by photothermal sensitizing effect of the ultrathin film of InN.

Furthermore, the tandem structure mentioned in the sixth embodiment, i.e., conversion efficiency of 0.92-cutoff compares favorably with that of 0.63-cutoff. Generation of lattice defect for the tandem-type solar cell is suppressed to reduce electric current leakage by combination of photothermal effect, and mixed crystal composition ratio. Moreover, problem of p-type conductivity control is also avoided in indium nitride and indium gallium nitride mixed crystal with high indium composition. The solar cell having high photoelectric conversion efficiency is provided and shows remarkable superiority in the present invention. This is not expected in a conventional technique.

Furthermore, since number of photons used in intraband transition is increasing in 0.92-cutoff compared to 0.63-cutoff, photothermal effect is more facilitated.

As mentioned above, according to the fourth, fifth, and sixth embodiments, control of absorption end wavelength of each cell is facilitated in the tandem-type solar cell, so that generation of lattice defect for the tandem-type solar cell is suppressed and electric current leakage is reduced. Moreover, problem of p-type conductivity control is also avoided in indium nitride or indium gallium nitride mixed crystal with high indium composition, thereby providing the solar cell having high photoelectric conversion efficiency.

The present invention is not limited to the first, second, third, fourth, fifth, and sixth embodiments. Moreover, these embodiments may be modified, replaced, and omitted within the scope of the invention.

INDUSTRIAL APPLICABILITY

A photoelectric conversion device according to the present invention can be used as a solar cell of a light focusing type on the ground or a solar cell loaded on satellite.

DESCRIPTION OF REFERENCE NUMERALS 110 solar cell
112 n-type indium gallium nitride pseudo-mixed crystal layer
113 sensitizer layer
114 p-type indium gallium nitride pseudo-mixed crystal layer
115 short period superlattice
117 short period superlattice
118 bottom layer
120 solar cell
122 n-type indium gallium nitride pseudo-mixed crystal layer
123 sensitizer layer
124 p-type indium gallium nitride pseudo-mixed crystal layer
125 short period superlattice
126 bottom layer
127 short period superlattice
128 bottom layer
136 short period superlattice
138 short period superlattice
139 short period superlattice
140 short period superlattice
100 solar cell
102 n-type semiconductor layer
104 p-type semiconductor layer
210 solar cell
212 n-type GaN layer
213 InN photosensitizer layer
214 p-type GaN layer
220 solar cell
222 n-type InGaN layer
223 InN photosensitizer layer
224 p-type InGaN layer
225 GaN layer

What is claimed is:

1. A solar cell is provided with:
   a first conductivity layer comprising a first band gap energy;
   an InN sensitizer layer formed on the first conductivity layer and comprising a third band gap energy; and
   a second conductivity layer formed on the sensitizer layer and comprising a second band gap energy,
   wherein at least one of the first conductivity layer and the second conductivity layer has InN of a first film thickness and GaN of a second film thickness,
   wherein the film thickness of the InN sensitizer layer is two molecular layers or less,
   wherein the first band gap energy and the second band gap energy are corresponding to about 2.13 eV, about 1.94 eV, about 1.63 eV, about 1.37 eV, about 1.25 eV, or about 0.94 eV,
   wherein the third band gap energy is less than the first band gap energy and the second band gap energy, and difference thereof is 500 meV or less,
   wherein an electric charge support generated in the InN sensitizer layer moves to at least one of the first conductivity layer and the second conductivity layer by intraband transition.

2. The solar cell according to claim 1, wherein the first film thickness is one molecular layer thickness of InN or the second film thickness is one molecular layer thickness of GaN.

3. The solar cell according to claim 1, wherein the first film thickness is x1 molecular layer thickness of InN and the second film thickness is x2 molecular layer thickness of GaN,
   wherein the ratio of x1 and x2, defined as x1/x2 is about one half, about two thirds, about one, about three seconds, two, or about four.

4. The solar cell according to claim 3, wherein x1 and x2 are natural numbers, and (x1, x2) =(1, 2), (2, 3), (1, 1), (3, 2), (2, 1), or (4, 1).

5. The solar cell according to claim 1, wherein the intraband transition is induced by light absorption of energy lower than 0.94 eV.

6. The solar cell according to claim 1, wherein the intraband transition is induced by thermal energy at room temperature or more.

* * * * *